US010530265B2

(12) United States Patent
Matlok

(10) Patent No.: US 10,530,265 B2
(45) Date of Patent: Jan. 7, 2020

(54) APPARATUS HAVING A DC-DC CONVERTER

(71) Applicant: Fraunhofer-Gesellschaft zur Foerderung der angewandten Forschung e.V., Munich (DE)

(72) Inventor: Stefan Matlok, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 16/246,186

(22) Filed: Jan. 11, 2019

(65) Prior Publication Data

US 2019/0222133 A1     Jul. 18, 2019

(30) Foreign Application Priority Data

Jan. 12, 2018    (EP) ..................................... 18151431

(51) Int. Cl.
*H02M 1/32*          (2007.01)
*H02M 3/335*        (2006.01)
*H03K 17/0814*     (2006.01)

(52) U.S. Cl.
CPC ......... *H02M 3/33592* (2013.01); *H02M 1/32* (2013.01); *H03K 17/08142* (2013.01)

(58) Field of Classification Search
CPC .......... H02M 1/32; H02M 1/36; H02M 3/335; H02M 3/33592; H03K 17/08; H03K 17/08122
See application file for complete search history.

(56) References Cited

U.S. PATENT DOCUMENTS 7,548,435 B2 *   6/2009   Mao ..................... H02M 3/156
                                                                      323/266
8,350,538 B2 *   1/2013   Cuk ..................... H02M 3/005
                                                                      323/222

(Continued)

FOREIGN PATENT DOCUMENTS

CA           2917727 A1 *   1/2015   ........... H01H 33/596

OTHER PUBLICATIONS

Burgos, Rolando et al., "Design Considerations of a Fast 0-Q Gate-Drive Circuit for 1.2 kV SiC JFET Devices in Phase-Leg Configuration", Energy Conversion Congress and Exposition, 2009,, ECCE, IEEE, IEEE, Piscataway, NJ, USA, Sep. 20, 2009, Seiten 2293-2300.

(Continued)

*Primary Examiner* — Matthew V Nguyen
(74) *Attorney, Agent, or Firm* — Perkins Coie LLP; Michael A. Glenn

(57) ABSTRACT

An apparatus includes a DC-DC converter having a semiconductor switch and a current source, wherein the DC-DC converter includes a commutation resonant circuit that is at least partially determined by parasitic characteristics of the DC-DC converter. The apparatus includes a driving unit configured to switch the semiconductor switch by performing a switching process. The driving unit is configured to perform the switching process with a switching duration that is shorter than a cycle duration of a resonant frequency of the commutation resonant circuit. Furthermore, the driving unit is configured to select a time instant of the switching process such that a current provided by the current source generates an overshoot at the semiconductor switch of at most 30% with respect to an idle state of the semiconductor switch.

20 Claims, 12 Drawing Sheets

(56) References Cited

U.S. PATENT DOCUMENTS

2017/0025954 A1* 1/2017 Barthold ............... H02M 3/155
2017/0229965 A1* 8/2017 Parto ..................... H02M 3/158

OTHER PUBLICATIONS

Guo, Suxuan et al., "3.38 Mhz Operation of 1.2kV SiC MOSFET with Integrated Ultra-Fast Gate Drive", 2015 IEEE 3rd Workshop on wide bandgap power devices and applications (WIPDA), IEEE, FREEDM Systems Center, North Carolina State University, Raleigh, Nov. 2, 2015, Seiten 390-395.

Matlok, S et al., "Switching SiC devices faster and more efficient using a DBC mounted terminal decoupling Si-RC element", Materials Science Forum, Trans Tech Publications Ltd., Sep. 25, 2016, Seite 1.

Zhang, Liqi et al., "Integrated SiC MOSFET module with ultra low parasitic inductance for noise free ultra high speed switching", 2015 IEEE 3rd Workshop on wide bandgap power devices and applications (WIPDA), IEEE, Nov. 2, 2015, Seiten 224-229.

* cited by examiner

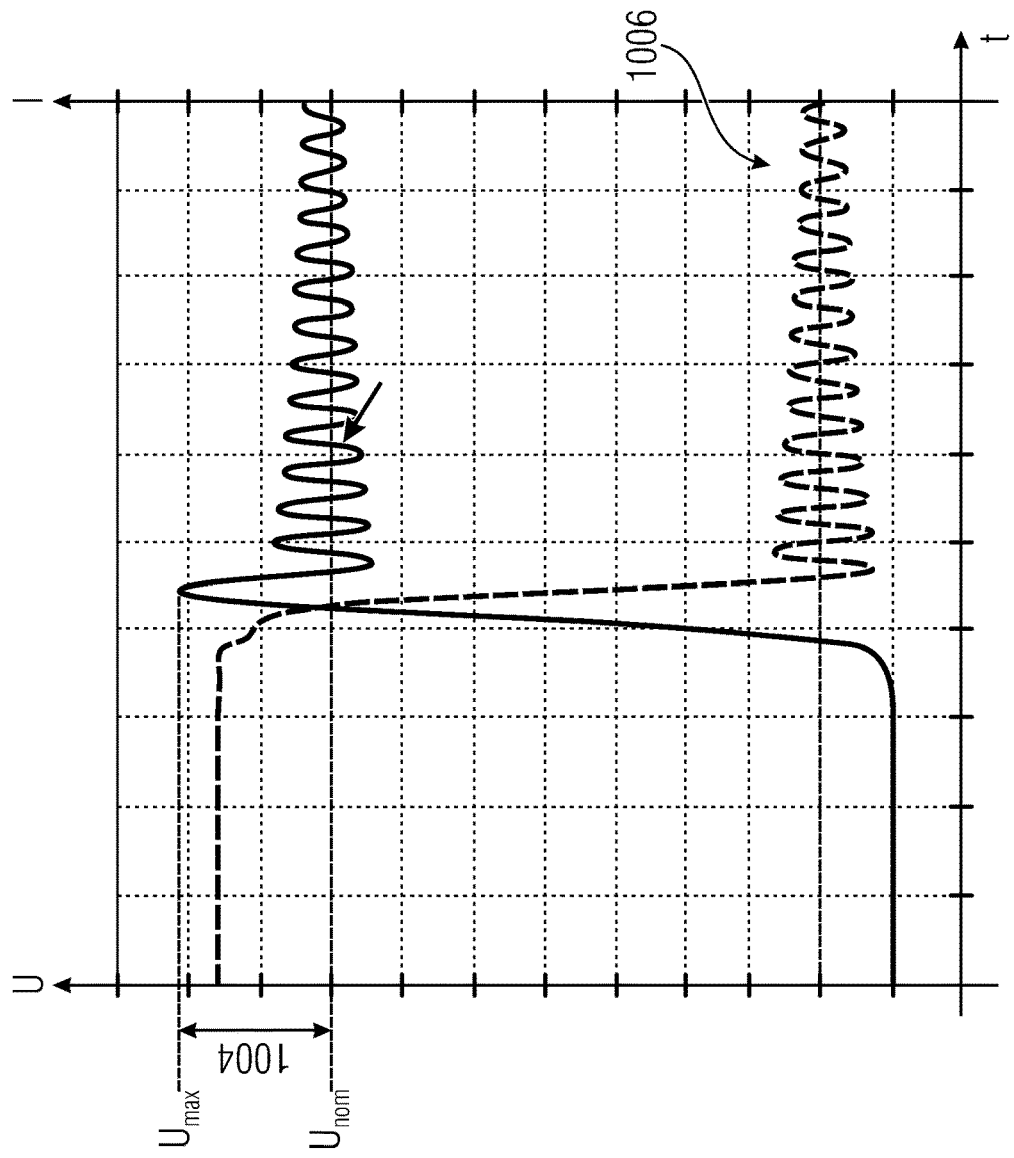
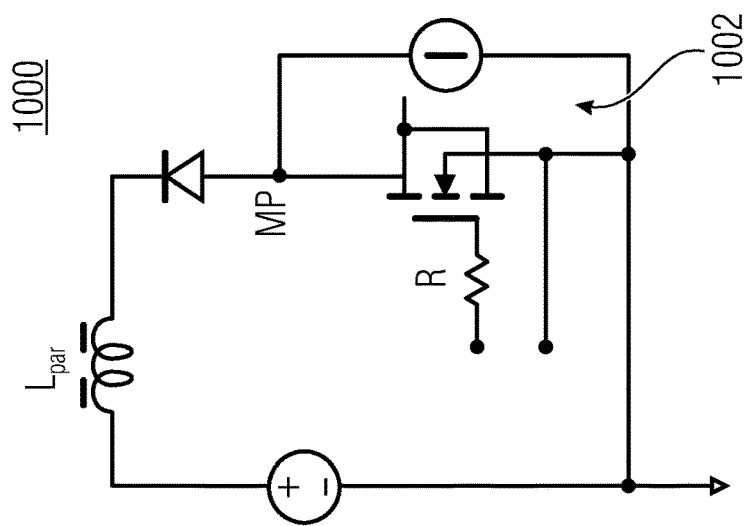
Fig. 8b (PRIOR ART)
Fig. 8a (PRIOR ART)

APPARATUS HAVING A DC-DC CONVERTER

CROSS-REFERENCE TO RELATED APPLICATION

This application claims priority from European Patent Application No. EP 18151431.6, which was filed on Jan. 12, 2018, and is incorporated herein in its entirety by reference.

BACKGROUND OF THE INVENTION

The present invention refers to an apparatus having a DC-DC converter, in particular a DC-DC converter having a semiconductor switch, which is driven in such a way that, despite a high switching speed, it exhibits small voltage overshoots during switching. This invention also refers to Zero Overvoltage Switching (ZOS), i.e. a voltage transformer having low voltage excessive peaks.

In power electronics, there are countless topologies and circuits which switch a current path on and off with the help of a transistor.

The current path to be switched consists of an electrical conductor and a conductor loop that, due to natural laws, also forms a parasitic inductance. This inductance, typically in the range from 1 to 100 nH, prevents the switching process from taking place at any desired speed. With increasingly faster switching processes in the range from 1 to 1000 ns (depending on the power class), high switch-off overvoltages occur at the switching element, i.e. at the transistor, especially when switching off.

FIG. 8a and FIG. 8b show a schematic block circuit diagram of a state of the art DC-DC converter 1000 as well as a schematic graph with a progression of a voltage U and a current I through a MOSFET 1002 (MOSFET=metal oxide semiconductor field-effect transistor), which are plotted on a common time axis t. For example, the DC-DC converter 1000 has a gate resistance R of, e.g., 10 ohms, which results in a significantly reduced switching speed compared to an absence of the gate resistance. Nevertheless, when switching off the MOSFET 1002, overvoltages or an overshoot 1004 may occur, this may be described by exceeding a nominal voltage Unom up to a maximum voltage level Umax, which means that an overshoot 1004 may be defined as Umax-Unom or the amount thereof. If the voltage of a voltage source or the voltage $U_{nom}$ to be reached is, e.g., 800 V, $U_{max}$ may reach up to 1000 V, so that the overvoltage 1004 may have a value of 200 V. These are only exemplary values. The subsequent oscillations 1006 of the current and the voltage shown in FIG. 8b may cause problems as to the electromagnetic compatibility (EMC).

In other words, FIG. 8a and FIG. 8b show a classical double pulse test setup with real devices, i.e. they do not show ideal switches or diodes.

This problem of switch-off overvoltage due to the parasitic inductance has been discussed by experts for decades. Known remedies are, e.g., braking the switching process by means of larger gate series resistances (gate pre-resistance). However, this leads to high and undesirable switching losses.

Other concepts use a changed topology, for example resonant circuits, accordingly having other advantages and disadvantages.

Other concepts aim at minimizing the commutation inductance by adding pulse capacitors or so-called snubbers.

Snubbers are also means for achieving Zero Voltage Switching proposed in "3.38 MHz operation of 1.2 kV SiC MOSFET with integrated ultra-fast gate drive" (2015 IEEE 3$^{rd}$ Workshop on Wide Bandgap Power Devices and Applications (WIPDA)).

However, new challenges also arise, e.g. through SiC switches and/or GaN switches and/or modern and very fast Si switches, such as IGBT 5 and/or Si-MOSFETs. If allowed, these may switch extremely fast, so that switching durations in the range of 10 ns and below may be achieved with the switch. For years, experts have therefore been trying to construct low-inductance geometries of the commutation cell. This includes reducing conductor spacing, inserting foils instead of wires, forming flat terminal pads and using printed circuit boards and the SMD technology (SMD=surface mounted device) instead of discrete packages housings and modules.

Therefore, concepts enabling low circuit losses and low overvoltages would be desirable for the control of DC-DC converters.

SUMMARY

According to an embodiment, an apparatus may have: a DC-DC converter having a semiconductor switch and a current source, the DC-DC converter having a commutation resonant circuit that is at least partially determined by parasitic characteristics of the DC-DC converter; a driving unit configured to switch the semiconductor switch by performing a switching process; wherein the driving unit is configured to perform the switching process with a switching duration that is shorter than a cycle duration of a resonant frequency of the commutation resonant circuit; and wherein the driving unit is configured to select a time instant of the switching process such that a current provided by the current source generates an overshoot at the semiconductor switch of at most 30% with respect to an idle state of the semiconductor switch.

According to another embodiment, an electric circuit may have an inventive apparatus and an electric voltage source coupled to the semiconductor switch; wherein the electric voltage source is configured to, during an operation of the apparatus, apply to the DC-DC converter an electric voltage that temporarily corresponds to at least 84% of a blocking voltage of the semiconductor switch; or wherein the DC-DC converter is configured to, based on an electric input voltage provided by the electric voltage source, provide an electric output voltage that temporarily corresponds to at least 84% of a blocking voltage of the semiconductor switch.

According to another embodiment, an apparatus may have: a DC-DC converter with a first side and a second side, having arranged therebetween a commutation cell including a semiconductor switch and a free-wheeling element; wherein the commutation circuit is connected to a current source configured to provide a phase current for the DC-DC converter; wherein, during an idle state of the semiconductor switch, a commutation voltage is present in the commutation cell; wherein the commutation circuit has a commutation resonant circuit including an electric inductance value and an electric capacitance value, wherein the commutation resonant circuit is formed such that, within a tolerance range of 30%, the following applies:

$$I_{PH} = \frac{2U_{ZK}\sqrt{2\frac{C}{L}}}{\pi}$$

wherein $I_{IP}$ describes the phase current at the switching time instant, $U_{ZK}$ describes the commutation voltage, C describes the electric capacitance value and L describes the electric inductance value.

The core idea of the present invention is to have realized that the parasitic elements/capacitances and inductances form parasitic resonant circuits which may be advantageously used for the switching process through particularly short switching times and an appropriate selection of the current to be switched. The advantage of this lies in the minimal/short switching time which enables low/no switching losses while simultaneously enabling low/no switch-off overvoltages and a low/no parasitic oscillation despite the presence of a parasitic commutation circuit inductance.

According to an embodiment, an apparatus includes a DC-DC converter having a semiconductor switch and a current source. The DC-DC converter comprises a commutation resonant circuit that is at least partially determined by parasitic characteristics of the DC-DC converter as well as by the switching states of the active devices. The apparatus includes a driving unit configured to switch the semiconductor switch by performing a switching process. The driving unit is configured to perform the switching process with a switching duration that is shorter than a cycle duration of a resonant frequency of the commutation resonant circuit. The driving unit is configured to select a time instant of the switching process such that a flowing current provided by the current source generates an overshoot at the semiconductor switch of at most 30% with respect to an idle state of the semiconductor switch.

According to an embodiment, the DC-DC converter comprises a free-wheeling element that, together with the semiconductor switch, is part of a commutation circuit. For example, this free-wheeling element may be a diode or a transistor. A first electric capacitance value acting in parallel to the free-wheeling element and a second electric capacitance value acting in parallel to the semiconductor switch are equal within a tolerance range of 30%, wherein the first capacitance value and the second capacitance value act in the commutation resonant circuit. The symmetry of the capacitances enables a particularly advantageous switching process.

According to an embodiment, the first electric capacitance value or the second electric capacitance value is formed by a combination of a parasitic electric capacitance value and a capacitive device. This means that, in addition to parasitic capacitance values, devices with capacitive characteristics may be arranged in order to obtain the desired capacitance value. This enables adjusting any DC-DC converter circuit to the desired type of operation.

According to an embodiment, the commutation resonant circuit includes at least one electric capacitance value acting in parallel to the active devices and one electric inductance value connected in series. The electric inductance value may be parasitic stray inductances or added inductances that, together with the capacitances, may form a resonant circuit.

According to an embodiment, the driving unit is configured to, in order to generate the overshoot at the semiconductor switch of at most 30% with respect to an idle state of the semiconductor switch, select the time instant of the switching process such that the current provided by the current source fulfills the following condition within a tolerance range of 30%:

$$I_{PH} = \frac{2U_{ZK}\sqrt{2\frac{C_{par}}{L_{par}}}}{\pi}$$

wherein $I_{PH}$ includes the current of the current source at the switching time instant, $U_{ZK}$ includes an electric voltage of the DC-DC converter, $C_{par}$ includes a parasitic electric capacitance value of the DC-DC converter and $L_{par}$ includes a parasitic inductance value of the DC-DC converter. It is advantageous that, by fulfilling the above condition with increasing accuracy, an increasingly lower amount of overshoots may be obtained.

According to an embodiment, the driving unit is configured to perform the switching process with a switching duration that is shorter than half of a cycle duration of a resonant frequency of the commutation resonant circuit. This enables a step-shaped excitation or an excitation according to a so-called step function/Heaviside function and therefore a low amount of overshoots.

According to an embodiment, the driving unit is configured to perform the switching process with a switching duration that is shorter than 8 ns. This also enables obtaining the excitation of the commutation resonant circuit with high frequencies and therefore exciting the parasitic resonant circuit and obtaining low overshoots after stopping the commutation process.

According to an embodiment, the semiconductor switch comprises a control terminal, e.g. a gate terminal that is connected to the driving unit. A resistance value or an impedance (since the gate circuit may also have a high parasitic inductance) between the driving unit and the control terminal has a value of one ohm at the most. A lower or even minimal gate resistance enables obtaining steep switching slopes and consequently also a step-shaped excitation of commutation resonant circuit, among other things, by shorter switching durations.

According to an embodiment, the apparatus is formed in absence of a gate series resistance element so that only the output resistance of the driving unit, parasitic resistances and inductances, or impedances act, leading to a lowest possible effective gate resistance and consequently to low overshoots and fast switching times, i.e. shorter switching durations.

According to an embodiment, the commutation resonant circuit is excited by the switching process. The DC-DC converter comprises a commutation circuit including a free-wheeling diode, the free-wheeling diode being effective to stop an oscillation of the commutation resonant circuit after the end of the commutation so that the commutation resonant circuit performs an incomplete oscillation at the most. This makes it possible to obtain low overshoots.

According to an embodiment, the semiconductor switch is configured to be operated in an intended operation in a hard-switching manner, which means to be operated during a current flow and with a voltage present. This makes it possible to switch the switch at any time instant during operation.

According to an embodiment, the control unit is configured to hard-switch the semiconductor switch. This makes it possible to set the best possible switching time instants.

According to an embodiment, the DC-DC converter includes one of a boost converter, a buck converter, a half-bridge converter, a full-bridge converter, an inverting converter and a flyback converter. This means that the inventive driving manner may be transferred to any DC-DC converter.

According to an embodiment, an electric circuit includes an apparatus according to embodiments described herein as well as an electric voltage source coupled to the semiconductor switch, e.g., at an input side or at an output side. The electric voltage source is configured to, during an operation of the apparatus, temporarily apply an electric voltage to the DC-DC converter, which corresponds to at least 84% of a blocking voltage of a semiconductor. Alternatively or additionally, the DC-DC converter is configured to, based on an electric input voltage provided by the electric voltage source, temporarily provide an electric output voltage corresponding to at least 84% of a blockage voltage of a semiconductor switch. This makes it possible to dimension the semiconductor switch such that it is operated with voltages of at least 84% of the blocking voltage (maximum voltage in the intended operation). This means that, according to embodiments, an excessive overdimensioning of the electrical strength of the semiconductor switch may be refrained from, which may lead to lower requirements as to chip surface area, electric power, construction volume and/or costs.

According to an embodiment, an apparatus includes a DC-DC converter with a first side and a second side, having arranged therebetween a commutation cell including a semiconductor switch and a free-wheeling element. The commutation circuit is connected to a current source configured to provide a phase current for the DC-DC converter. During an idle state of the semiconductor switch, a commutation voltage is present in the commutation cell. The commutation circuit comprises a commutation resonant circuit including an electric inductance and an electric capacitance, wherein the commutation resonant circuit is configured such that, within a tolerant region of 30%, the following applies:

$$I_{PH} = \frac{2U_{ZK}\sqrt{2\frac{C}{L}}}{\pi}$$

wherein $I_{PH}$ describes the phase current at the switching time instant, $U_{ZK}$ describes the commutation voltage, C describes the electric capacitance and L describes the electric inductance.

BRIEF DESCRIPTION OF THE DRAWINGS

Embodiments of the present invention will be detailed subsequently referring to the appended drawings, in which:

FIG. 8a shows a schematic block circuit diagram of a DC-DC converter according to the conventional technology as well as a schematic graph with a progression of a voltage U and a current I through a MOSFET; and FIG. 8b shows a schematic graph with a progression of a voltage and a current through a MOSFET of the DC-DC converter of FIG. 8a.

DETAILED DESCRIPTION OF THE INVENTION

Figure 1:
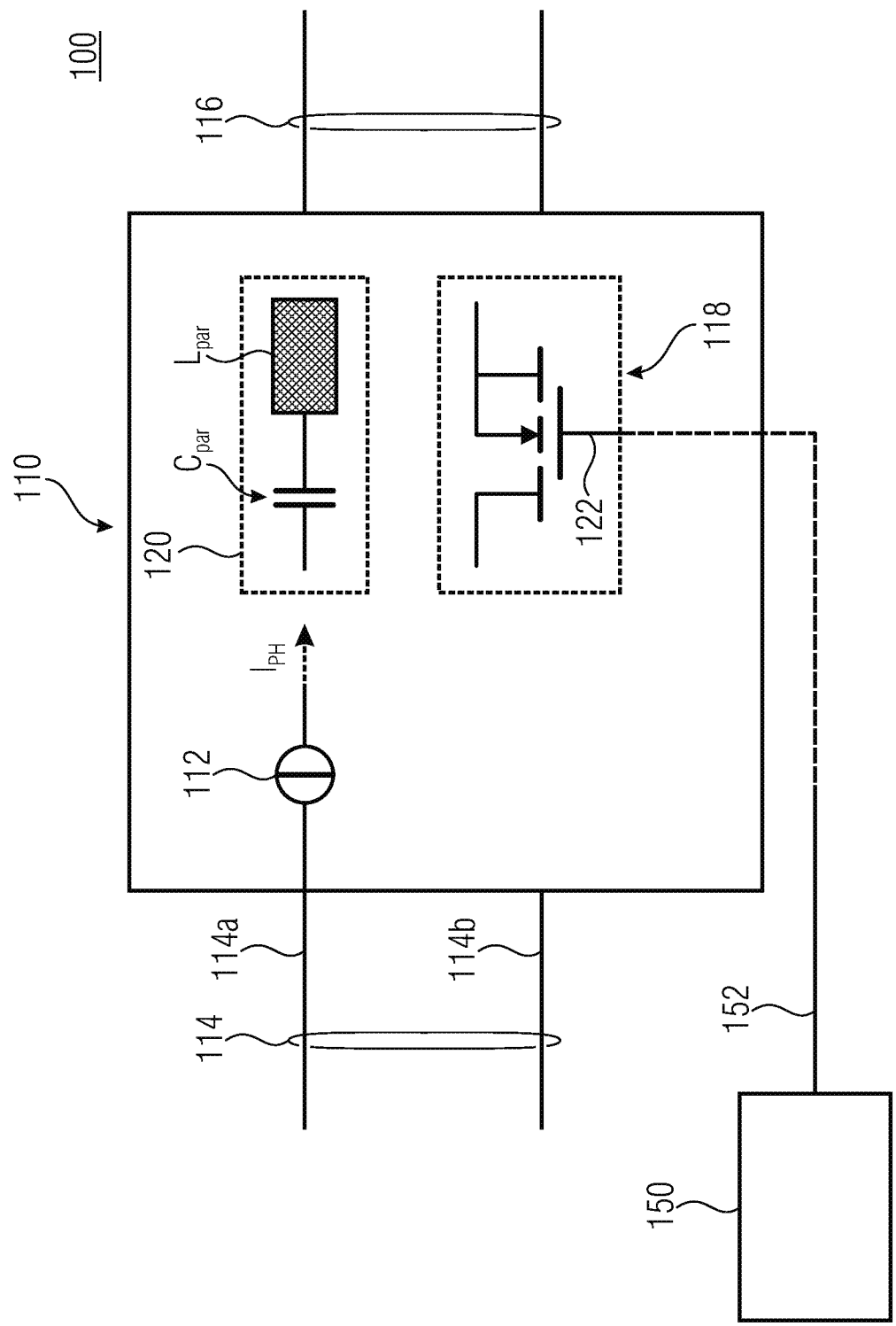
FIG. 1 shows a schematic block circuit diagram of an apparatus according to an embodiment.

Before embodiments of the present invention are subsequently described in more detail based on the drawings, it is to be noted that identical, functionally-identical or operationally identical elements and/or structures in the different figures are provided with the same reference numerals so that the description of these elements in the different embodiments is interchangeable and/or may be applied to each other.

Subsequent embodiments refer to DC-DC converters. DC-DC converters may be configured to convert a DC voltage with a first electric voltage level or potential to a second electric voltage level or potential, wherein the second level may be higher or lower than the first level. DC-DC converters may comprise a semiconductor switch that is switched by a driving unit. Although subsequent embodiments are described such that the DC-DC converters described therein comprise MOSFET transistors, other semiconductor switches may alternatively or additionally be used, e.g., bipolar transistors and/or transistors manufactured in any other manufacturing technology than MOS.

Subsequent embodiments refer to switching processes in semiconductor switches. In the context of the embodiments described herein, these are associated with commutation processes and commutation circuits of the DC-DC converter described herein, i.e., the commutation processes triggered by the switching process. In this respect, in the context of the embodiments described herein, it is synonymously said that a switching process excites an excitation resonant circuit of the commutation circuit and that a commutation process (triggered by the switching process) excites the excitation resonant circuit of the commutation circuit.

FIG. 1 shows a schematic block circuit diagram of an apparatus 100 according to an embodiment. The apparatus 100 includes a DC-DC converter 110 and a driving unit 150.

The DC-DC converter 110 includes a storage choke 112 that may be connected to an input terminal 114a or 114b of an input side 114, for example. The storage choke acts as a current source and is configured to provide the phase current $I_{PH}$. Instead of a coil or a choke, any other current source may alternatively or additionally be arranged. According to alternative embodiments, the current source, or the storage choke 112, may also be connected to an output side 116 and/or between the input side 114 and the output side 116.

The DC-DC converter 110 includes a semiconductor switch 118, which may be the semiconductor switch 1002, which is not required, however. The switch may switch indefinitely fast and also have a hard current break (snappy). As will be clarified later, it is advantageous to design the semiconductor switch 118 in such a way that it is configured to be operated in a hard-switching manner in its intended operation, e.g., as described in a data sheet. In particular, this may enable a hard-switching switch-off process of the switch. Optionally, a soft switch-on may also be carried out. This means that embodiments relate to an apparatus for a hard switch-off in combination with a soft switch-on (low currents and voltages). In embodiments described herein, the described ZOS switch-off processes may also be referred to as soft, namely as fast so-called ZVS (Zero Voltage Switching), which is enabled by the described commutation resonant circuits, however, an operation of the devices is carried out in the sense of hard-switching. Embodiments are therefore not limited to the implementation of hard-switching only, but may be combined with soft-switching processes. The operating point of some of the apparatuses described herein may be understood to be hard-switching, however, the enabled Zero Overvoltage Switching may be understood as a transformation towards soft-switching at this operating point. In accordance with this, the driving unit 150 may be configured to hard-switch the semiconductor switch 118, i.e. while a relevant and/or high current strength or voltage strength are present at the device.

The DC-DC converter 110 further includes a commutation resonant circuit 120 that may at least be partially formed of parasitic electric characteristics of the DC-DC converter 110. These include, e.g., line inductances and/or stray inductances of the DC-DC converter 110, which are exemplarily referred to as $L_{par}$. Alternatively or additionally, the commutation resonant circuit 120 may have parasitic capacitive characteristics which are exemplarily indicated by $C_{par}$ and may denote capacitances acting in parallel to the semiconductor switch 118, for example. The commutation resonant circuit 120 may comprise one or several resonant frequencies. For example, the commutation resonant circuit 120 may be modelled during the commutation process as a series resonant circuit including an inductance value L and a capacitance value C so that the resonant frequency may approximately be given by:

$$\frac{1}{2\pi\sqrt{LC}}$$

According to further embodiments, the commutation resonant circuit 120 may be modelled as a different type of resonant circuit, e.g., a parallel resonant circuit and/or comprise different and further parasitic values and/or devices that enable obtaining a resonant circuit that is able to resonate.

Switching processes of the semiconductor switch 118 may lead to the commutation resonant circuit 120 being excited, which may at least be partially caused by changes in the applied voltage, changes in the current flow through the switch and/or changes of voltages and/or current flows at other elements of the DC-DC converter 110. According to embodiments, elements of the commutation resonant circuit 120 are to be adjusted to each other. Additionally, e.g., in contrast to known circuits, some elements may be omitted, e.g., gate resistors, and/or separate/discrete and dimensioned devices may be added to parasitic capacitive and/or inductive characteristics of the DC-DC converter 110, which, in combination with the parasitic characteristics $C_{par}$ and/or $L_{par}$, may set a desired electric capacitance value or electric inductance value.

The driving unit 150 is connected to a control terminal 122 of the semiconductor switch 118, e.g. a gate terminal. Based on a control signal 152 that is transmitted from the driving unit 150 to the control terminal 122, the semiconductor switch 118 may be switched between a conducting and a non-conducting, or blocking, state.

The driving unit 150 is configured to perform the switching process with a switching duration that is shorter than a cycle duration of a resonant frequency of the commutation resonant circuit.

A resonant frequency of the commutation resonant circuit 120 may be affected by a cycle duration of a corresponding resonant frequency of the commutation resonant circuit 120. Now, the driving unit may be configured to adjust the switching duration, or perform the switching process with a corresponding speed, so that the switching duration is shorter than the cycle duration. It is to be noted that several definitions are known for performing a switching process, e.g., the transition of the corresponding value (gate voltage) from a maximum value to a minimum value, from 90% of the maximum value to 10% of the minimum value and the like. For the embodiments described herein, the switching duration is to be the duration in which the current decreases in the active region of the semiconductor switch from 90% of the phase current to 10% of the phase current. For example, the active region is here the physical region which converts the power into heat when a current and a voltage are present. Excluded therefrom are, e.g., reactive currents due to parasitic capacitances, which allow a current flow at the external terminals of the transistor even outside of the switching time definition.

In contrast to known and rather slow switching processes, the terms "switching duration" and "switching edges" are at most conditionally compatible in very fast-switching circuits that lie within the scope of the present embodiments. For example, the switching duration Δt describes the switch-off of an inner physical channel of a transistor. Due to existing parasitics (such as capacitances), the switching process is not yet complete even after the actual switching time Δt. The load current can still charge the capacitors and carry out the commutation even after the switching process, i.e. at times greater than Δt. The resulting current and voltage forms only subsequently form a switching edge, i.e. after Δt. In the case of a metal oxide-semiconductor based field effect transistor (MOSFET), the effect may also be described in such a way that the gate is already completely unloaded before the commutation takes place or is completed.

Such a described fast switching process with a short switching duration enables a broadband application of the commutation resonant circuit 120 and consequently the introduction of energy into the commutation resonant circuit 120.

Additionally, the driving unit 150 is configured to select a time instant of the switching process such that a current $I_{PH}$ flowing through the storage choke 112 at the time instant of the switching process, i.e. a current provided by the current source, generates an overshoot at the semiconductor switch 118 of at most 30% with respect to an idle state of the semiconductor switch. According to further advantageous embodiments, the driving unit 150 is configured to select a time instant of the switching process such that the current $I_{PH}$ flowing through the storage choke (current source) 112 at the time instant of the switching process generates an overshoot at the semiconductor switch 118 of at most 20% or at most 15% with respect to the idle state of the semiconductor switch. The stated criteria may apply for switching on as well as for switching off the semiconductor switch 118. For example, the blocking state of the semiconductor switch 118, in which, compared to other operating states, a maximum voltage or intermediate circuit voltage drops at the semiconductor switch 18, or between the power terminals of the same, may be considered to be the idle state.

Figure 2A:
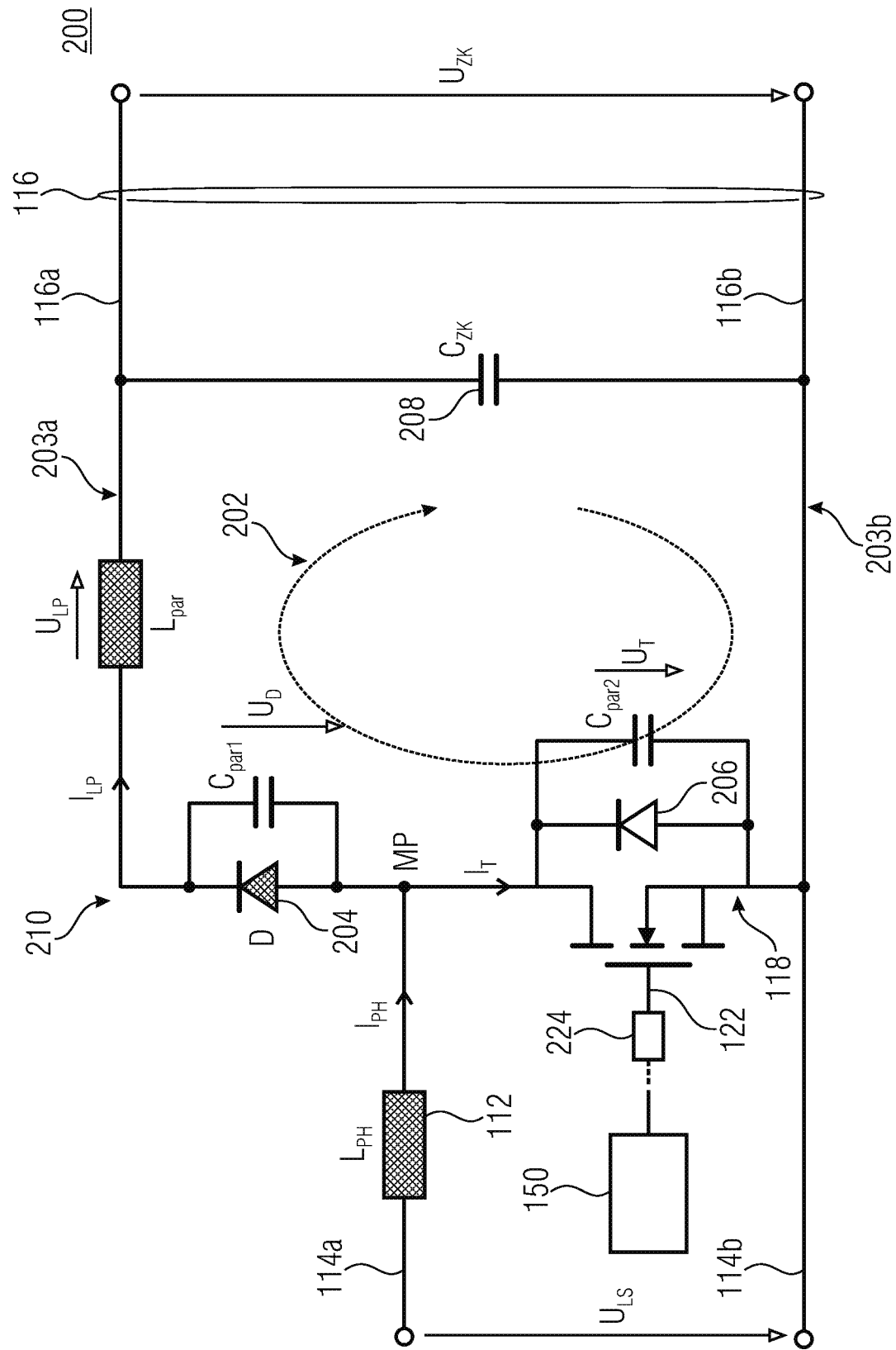
FIG. 2a shows a schematic block circuit diagram of an apparatus according to a further embodiment.

FIG. 2a shows a schematic block circuit diagram of an apparatus 200 according to an embodiment, to which the discussions in connection with the apparatus 100 apply. The apparatus 200 includes a DC-DC converter 210 with a function that is comparable to the description in connection with the DC-DC converter 110. The parasitic inductance $L_{par}$ is illustrated as an element of a commutation circuit 202. The parasitic inductance may be arranged or contained in a bus bar, i.e. electric terminal leads 203a and 203b, at least partially, however, advantageously with a main proportion of at least 50%, at least 60% or at least 70%. The terminal leads 203a and 203b make it possible to electrically contact the first side 114, the second side 116 and the semiconductor switch 118. Among other things, the parasitic inductance may be affected by a material of the electric terminal leads 203a and/or 203b, by a distance between the individual leads 203a and 203b and/or by a geometry of the same, e.g., a cross-section and/or a length and/or an axial progression, e.g., straight, curved or meandering. It is to be noted that this is not necessarily to be understood in such a way that the parasitic inductance $L_{par}$ is an identifiable or individually and specially integrated device. Furthermore, the schematic illustration of FIG. 2a does not mean that the parasitic inductance $L_{par}$ is only arranged at a single position. Rather, the parasitic inductance $L_{par}$ may be a distributed inductance, e.g., a stray inductance and/or an electric inductance which is at least partially effective through an electric lead or in the intermediate circuit capacitor or the like. This means that the schematic illustration of FIG. 2a is not to be understood in the sense that an exact location of the parasitic inductance $L_{par}$ is set.

The commutation circuit may be modelled as an inductance value L and a capacitance value $C_{par1}$, as well as $C_{par2}$ so that the resonance frequencies may approximately be given by:

$$\frac{1}{2\pi\sqrt{L\frac{C_{par1}C_{par2}}{C_{par1}+C_{par2}}}}$$

For example, after the commutation process a capacitance may be short-circuited by an active device, e.g., by a free-wheeling element 204, so that the same is no longer effective in the resonant circuit. The resonant circuit frequency of the commutation resonant circuit changes to, e.g.:

$$\frac{1}{2\pi\sqrt{LC_{par2}}}$$

It is to be noted that the inductance $L_{par}$ is not effective between the active devices 204 and 118 or only to a small extent, but at distance thereof, e.g., at the leads. This means that the inductance is advantageously not effective between the two active devices, e.g., the free-wheeling element 204 and the semiconductor switch 118, but in the path around the devices, e.g., via the terminals of the half-bridge or in the path of the intermediate circuit capacitor. Furthermore, $L_{par}$ may also be increased by a discrete device in order to reach the desired commutation inductance values. Furthermore, the electric conductors may be configured to have a desired parasitic inductance value, e.g., by larger distances between the conductors.

Based on the different states of the switch, the commutation resonant circuit may be determined by different elements with regard to its resonant frequency. Therefore, with asymmetry of the commutation resonant circuit 202, the resonant frequency may be temporarily variable. It may be affected at a first time instant at which the current runs across the free-wheeling element 204 by the capacitance $C_{par1}$ as well as by the proportion of the parasitic inductance $L_{par}$ that is arranged along this path. At a second time instant, in which the current, e.g., runs across the switch 118, the resonant frequency may be affected by the capacitance $C_{par2}$ as well as by the proportion of the parasitic inductance $L_{par}$ that is arranged along this other path.

The parasitic inductance $L_{par}$ is to be understood in such a way that it forms part of the commutation circuit 202. The commutation circuit 202 further comprises a free-wheeling element 204 that is provided with the symbol D. For example, the free-wheeling element 204 may be a free-wheeling diode, a free-wheeling path, a free-wheeling device, a transistor, a diode and/or a body diode. A parasitic electric capacitance $C_{par1}$ may act in parallel to the free-wheeling element 204. Together with the parasitic inductance $L_{par}$, this parasitic capacitance may form at least part of a series resonant circuit. The free-wheeling element 204 may also be implemented as a stand-alone device, but may also be configured as part of at least one transistor and, e.g., as a body diode.

Alternatively or additionally, a stand-alone or parasitic diode 206 may be arranged in parallel to the semiconductor switch 118, wherein a parasitic capacitance $C_{par2}$ may act in parallel to the diode 206, which may therefore also act in parallel to the semiconductor switch 118. Even in the absence of the diode 206, the parasitic capacitance $C_{par2}$ may act in parallel to the semiconductor switch 118. The commutation resonant circuit may be part of the commutation cell of the DC-DC converter 210.

Furthermore, the commutation circuit 202 may comprise an intermediate circuit capacitor 208 that is indicated by $C_{ZK}$. Through the intermediate circuit capacitor 208, an output voltage $U_{ZK}$ may drop at the output side 116.

The apparatus 200 may comprise a gate series resistance 224 that is connected between the driving unit 150 and the control terminal 112. The gate series resistor may comprise discrete elements and/or parasitic characteristics and may cause that a switching process of the semiconductor switch 118 involves a finitely short time span.

The storage choke 112 may be electrically coupled to the commutation circuit and may be coupled, e.g., between the terminal 114a and the commutation circuit 202. The current source may be connected such that a first side is directly or indirectly coupled to the input terminal 114a and a second side of the storage choke 112 is coupled between a power terminal of semiconductor switch 118 and the free-wheeling element 204, such a coupling location being designated by MP (midpoint). The point MP may form a central tap of a capacitive voltage divider that is at least partially formed by the parasitic capacitances $C_{par1}$ and $C_{par2}$. This means that the following may apply: a voltage $U_D$ dropping over the diode, or over the parasitic capacitance $C_{par1}$, together with a voltage $U_T$ dropping over the semiconductor switch 118, or over the parasitic capacitance $C_{par2}$, is equal to the voltage $U_{ZK}$ dropping over the commutation capacitor, i.e., the following may apply in a stationary case:

$$U_D+U_T=U_{ZK}$$

This means that the commutation voltage $U_{ZK}$ may be a voltage dropping over the commutation cell, or the electric elements arranged therein. As is shown in FIG. 2a, a voltage $U_{LP}$ may additionally act during the commutation process via the inductance of the commutation resonant circuit.

It is to be noted that, in the switching case, i.e. in the case of the resonant oscillation, the voltage occurring via the parasitic inductance $L_{par}$ may also be added to this consideration. Thus, the current $I_{PH}$ may be described as the sum of the currents $I_{LP}$ through the parasitic inductance $L_{par}$ and a current $I_T$ through the transistor 118, i.e., the following may apply:

$$I_{PH}=I_{LP}+I_T$$

A voltage $U_{LS}$ at the input side may at least partially contribute to the flow of the current $I_{PH}$.

According to an embodiment, the electric capacitance values of the parasitic capacitances $C_{par1}$ and $C_{par2}$ are equal within a tolerance range of 30%, advantageously 20% and advantageously 10%. Alternatively, the capacitance values that act overall are equal, wherein, at the location $C_{par1}$ and $C_{par2}$, the capacitance values that act overall are understood to be a combination of the parasitic capacitance with a capacitive device. This means that a difference between the parasitic capacitances may be compensated by an additional device in order to generate a symmetry so that $C_{par1}=C_{par2}$ is valid within the tolerance range.

In other words, assuming that $C_{par1}$, $C_{par2}$ and the distributed inductance $L_{par}$ are ideal, i.e., linear and without losses, the following may apply for the Zero Overvoltage Switching according to embodiments: capacitances $C_{par1}=C_{par2}=C_{par}$. Approximately, the phase current $I_{PH}$ does not change due to the high inductance of $L_{PH}$ due to the switching process. For the current, the following connection can be set for the ZOS switching:

$$I_{PH} = \frac{2U_{ZK}\sqrt{2\frac{C_{par}}{L_{par}}}}{\pi}$$

Thus, as a clear and distinct result of this, a rule for the implementation of the components and/or parasitic characteristics such as $L_{par}$, $C_{par}$ depending on the desired current and/or the desired voltage at the switching point may be obtained by changing the formula.

It is to be noted that the above formula describes the searched current at linear capacitances. However, switching semiconductor elements such as transistors may have a strongly non-linear capacitance progression. Here, the searched current may be determined numerically or by simulation or a suitable linear replacement capacitance $C_{par}$ may be applied for a calculation.

In particular, according to embodiments of the invention, an apparatus is to be configured such that it fulfills the above equation within a tolerance range of 30%, 20%, or 10% or more precisely. The apparatus may comprise a DC-DC converter. The same may comprise a first side, e.g. the side 114, and a second side, e.g. the side 116, having arranged therebetween a commutation cell. The same may include a semiconductor switch, e.g. the semiconductor switch 118, and a free-wheeling element, e.g. the free-wheeling element 204. The commutation circuit is connected to a current source, e.g. the current source 112, i.e. electrically coupled to the same, which is configured to provide the phase current $I_{PH}$ for the DC-DC converter. During an idle state of the semiconductor switch, a commutation voltage $U_{ZK}$ is present in the commutation cell. The commutation circuit includes a commutation resonant circuit, e.g. the commutation resonant circuit 202, i.e. parasitic capacitances and inductances and optionally also further, if applicable, discrete capacitive and/or inductive elements, in order to adjust the excitation resonant circuit. Here, the optional additional elements, in particular the inductive elements, may also occur via a special adjustment of the bus bar (terminal leads) and/or the other terminal elements of the semiconductor switch, e.g. by introducing magnetic or ferromagnetic materials into a material of the terminal bars or terminal leads and/or adapting their cross-sectional length. The commutation resonant circuit is formed such that the following applies within the tolerance range:

$$I_{PH} = \frac{2U_{ZK}\sqrt{2\frac{C}{L}}}{\pi}$$

wherein $I_{PH}$ describes the phase current at the switching time instant, $U_{ZK}$ describes the commutation voltage, C describes the electric capacitance and L describes the electric inductance. This is an embodiment that is linked to the other examples disclosed herein. The respective explanations may be interchanged and combined, i.e. the adjustment of the commutation circuit as well as the sufficiently fast driving may be understood to be complementary expressions of the same invention. In the symmetrical case, $C_{par1}=C_{par2}=C_{par}=C$ may apply.

In other words, FIG. 2a shows a ZOS circuit (ZOS=Zero Overvoltage Switching), wherein the driving unit 150 is configured to implement a ZOS operating mode which is described below. Among other things, the ZOS circuit is characterized by one or several of the following characteristics:

Adding or increasing an inductance in the commutation circuit 202, i.e. the inductance may be set freely;

Adding or increasing one or several parallel capacitances of the switching elements (e.g. transistors or diodes), i.e. the parallel capacitances may be set freely;

Removing or reducing the gate series resistances and gate lead impedances in order to enable fast switching or even switching with a maximum speed, i.e. the gate series resistances may be dimensioned arbitrarily and, in particular, may be dimensioned arbitrarily small; and It is possible to use snappy devices that switch at any speed or work with a typical hard current break, which causes a hard switch-off of the current and would only be usable with great effort according to known concepts.

The ZOS operating mode is characterized by several of the following characteristics:

The ZOS commutation processes are "hard", i.e. switch-off takes place at a high current and high voltage, simultaneously;

The ZOS operating mode regulates pulses and currents in such a way that commutation processes occur during switch-off in a certain ratio or relationship of current and voltage to one another, i.e. in such a way that the time instant of the switching process is selected such that a current flowing through the storage choke generates an overshoot at the semiconductor switch of at most 30%, advantageously at most 20%, and particularly advantageously of at most 10% with respect to the idle state of the semiconductor switch. The operating points used by the driving unit 150 represent a subset of the possible operating points in a comparatively small field of current and voltage, wherein tolerance values of ±30%, ±15%, ±10% or ±5% may be applied as maximum limits with respect to the current and/or the voltage;

At least some of the operating points apart from the ZOS operating points may lead to inadmissibly high overvoltages and/or switch-off energies and/or strong oscillations. According to the operation mode of the driving unit, this is avoided.

For this purpose, according to an implementation of embodiments described herein, the commutation circuit 202 is formed such that the devices or characteristics $C_{par1}$, $C_{par2}$, and $L_{par}$ acting as such are added, extended and/or used. With this, the commutation resonant circuit is at least partially formed. The commutation resonant circuit is arranged along the commutation cell, or the commutation circuit 202. The switching process excites the parasitic and/or additionally introduced elements in such a way that the resonant circuit formed of these elements oscillates in a particularly advantageous manner for the switching process. After ending the switching process, the oscillation is automatically stopped or at least reduced to a small amplitude by the active devices, e.g. the free-wheeling element 204. In order to excite the commutation resonant circuit at all, the switching process is carried out at a certain speed or switching duration or even as quickly as possible. An underlying ideal shape may be a step-shape (approximately infinitely steep edge). Increasingly steep edges enable the excitation of increasingly high frequencies with increasing amplitudes. However, this works without restriction even at such slow or fast speeds as real devices allow.

Figure 2B:
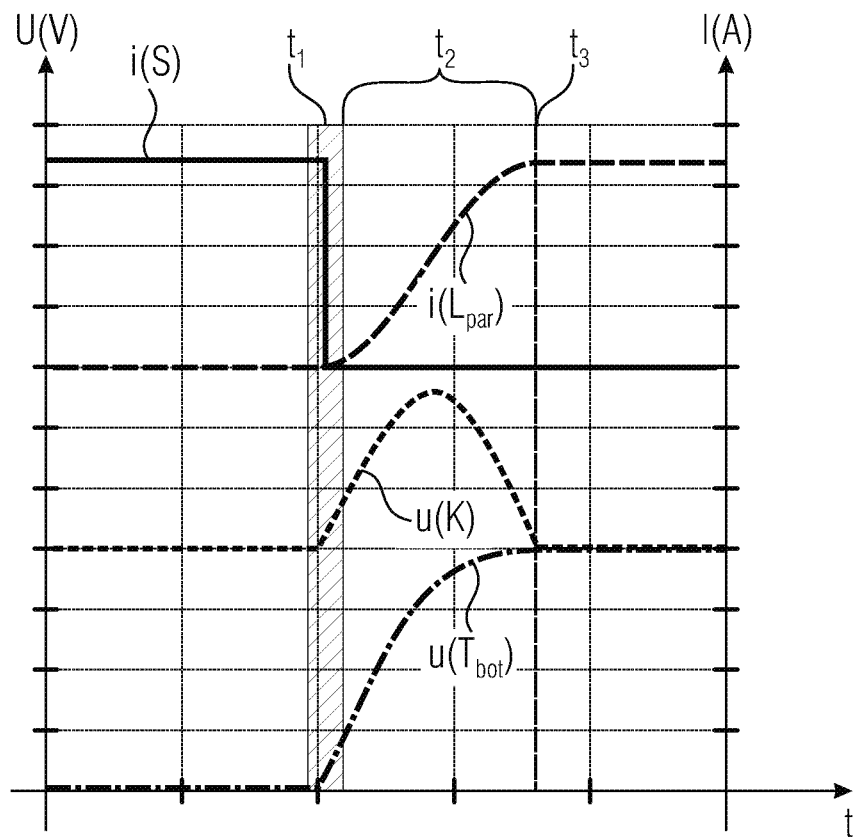
FIG. 2b shows a schematic graph of electric values of the apparatus of FIG. 2a during a switching process and a following commutation process.

For example, if the semiconductor switch 118 switches off, e.g. in a step-shaped manner, the load current $I_T$ begins to charge the parasitic or added capacitance $C_{par2}$ from the moment of the switch-off, as exemplarily shown in FIG. 2b, cf. time instant $t_1$. This means that the semiconductor switch 118 is switched off at the time instant $t_1$. As a result, the potential u(K) at the cathode of the diode or at point K of the upper free-wheeling element 204 increases up to a time instant $t_2$. This causes an increasing current $i(L_{par})$ through the parasitic inductance $L_{par}$. The resonant circuit of $C_{par2}$, $C_{par1}$ and $L_{par}$ is being excited. Through the commutation of the current to $L_{par}$, $C_{par2}$ is unloaded. Excited oscillations end after half a cycle duration at the time instant $t_3$ when the current $i(L_{par})$ is at a maximum.

According to the embodiment, the resonant circuit leads to the fact that the potential at the point MP ideally oscillates to the higher potential $U_{ZK}$, the commutation voltage. In this resonant circuit, due to the correct dimensioning and setting the ideal current, the corresponding load current $I_T = I_{PH}$ results in the parasitic inductance $L_{par}$ in the moment after the overshoot of the potential MP. This oscillation is interrupted again by the free-wheeling element and the converter is brought into the stationary state, if possible. Although the current in $L_{par}$ may overshoot to reach the desired target, this is not absolutely necessary.

According to an embodiment, the commutation of the current from the semiconductor switch 118 to the diode 204 already takes place during the rise of the MP point, without the occurrence of overvoltages that exceed the tolerance range and/or the occurrence of remaining oscillations.

Figure 3A:
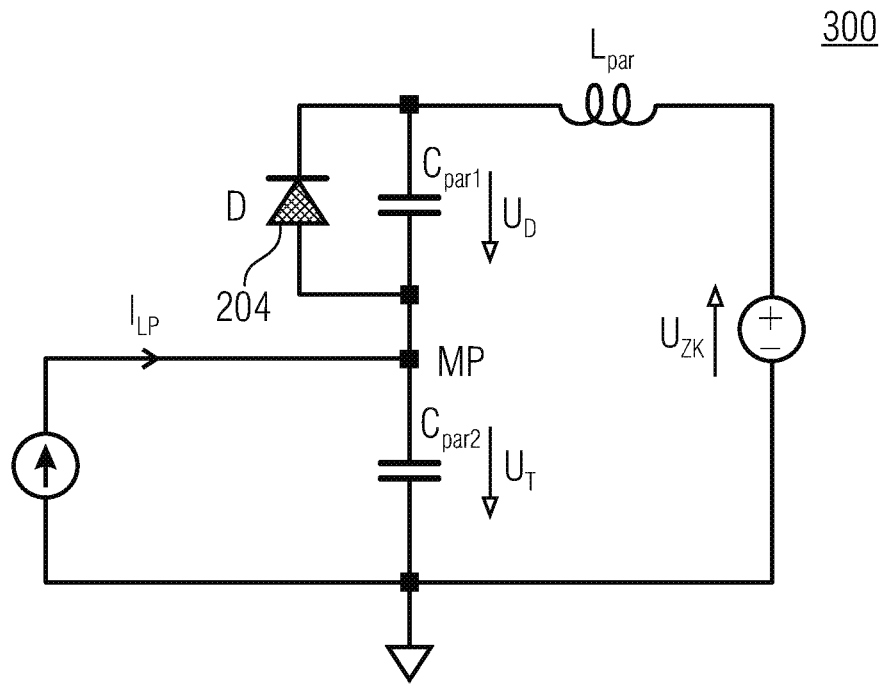
FIG. 3a shows a schematic block circuit diagram of a simulation basis of an apparatus according to an embodiment, comprising parasitic characteristics.
Figure 3B:
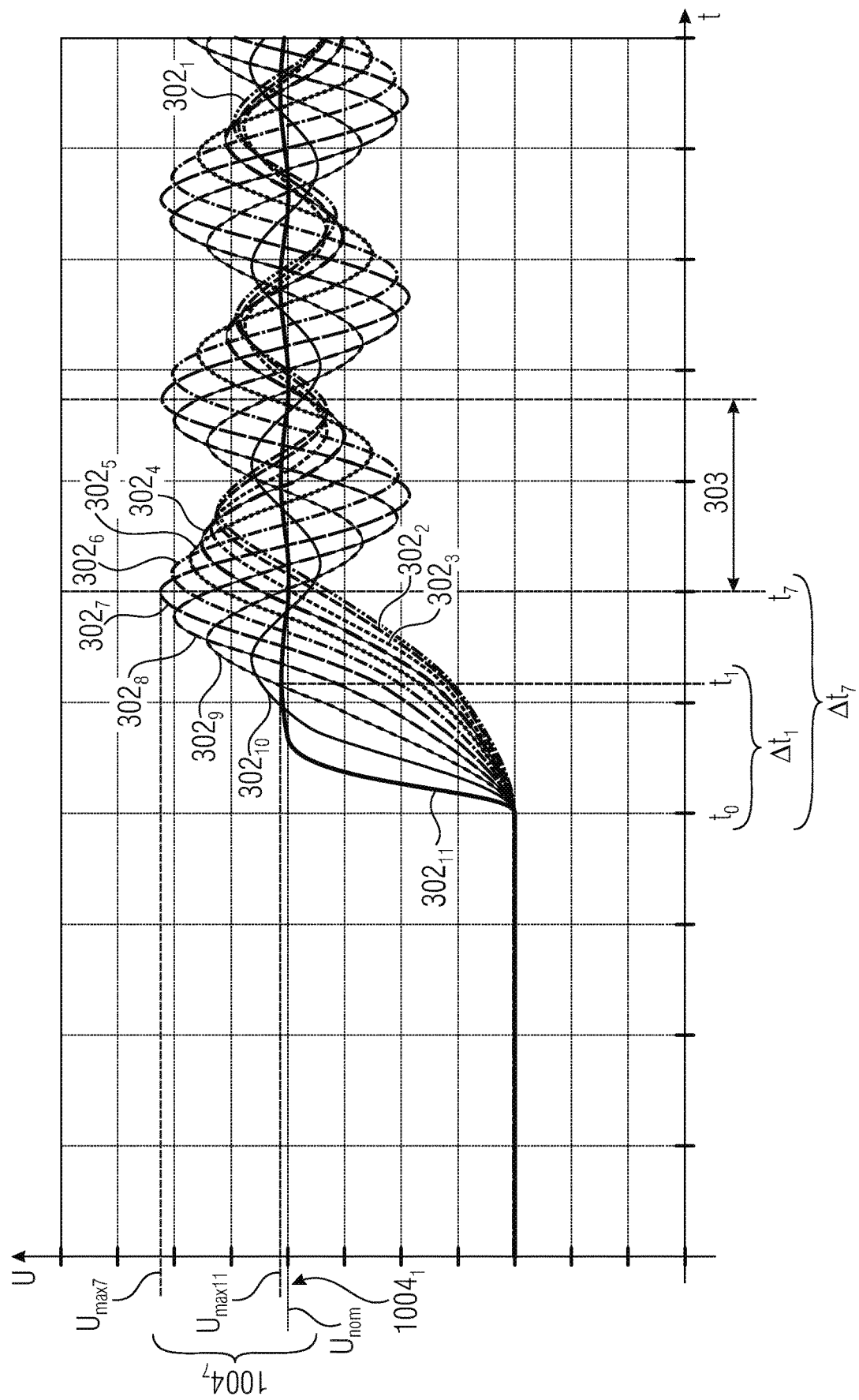
FIG. 3b shows a schematic diagram with a total of 11 curves that represent simulation results of the simulation basis of FIG. 3a according to embodiments.

The selection of the edge steepness, i.e. the duration of the switching, is explained based on FIGS. 3a and 3b. For this, FIG. 3a shows a schematic block circuit diagram of a simulation basis 300 comprising the parasitic characteristics $L_{par}$, $C_{par1}$ and $C_{par2}$, wherein, e.g., the current ILP and the commutation voltage $U_{ZK}$ are applied by the simulated current sources and voltage sources, respectively. The values for $C_{par1}$ and $C_{par2}$ were exemplarily set to 100 pF and the value for $L_{par}$ was set to 20 nH.

FIG. 3b shows a schematic diagram having a total of 11 curves $302_1$ to $302_{11}$ that illustrate a voltage U plotted at the ordinate over the axis time, or t. The curves $302_1$ to $302_{11}$ may be understood to be results of switching a semiconductor switch, e.g. the semiconductor switch 118 in the apparatus 100 or 200, which have been exemplarily determined in the simulation according to FIG. 3b. The curves $302_1$ to $302_{11}$ show switching processes that were performed with a different speed $\Delta t_{switch}$, wherein all curves $302_1$ to $302_{11}$ show a start of the switching process of the semiconductor switch at a time instant $t_0$. The curves $302_1$ to $302_{11}$ are determined in said order with decreasing switching times, wherein the curve $302_1$ may be based on a switching time of 20 ns, for example, the curve $302_7$, which illustrates the worst case, may be based on a switching time of approximately 8.88 ns, the curve $302_9$ may be based on a switching time of 5 ns, the curve $302_{10}$ may be based on a switching time of 3 ns and the curve $302_{11}$ may be based on a switching time of 1 ns. Accordingly, with an increasing curve index, a time $\Delta t$ until reaching a maximum of the oscillation amplitude decreases. The curves $302_i$ show excited oscillations that may comprise different phase positions or amplitudes with the same cycle duration 303.

It becomes clear that with decreasing switching time there is an increase of the overshoots $1004_i$ until the worst case is reached in curve 7. This is in accordance with known concepts. Surprisingly, it was found that, when coming below worst case switching time, the overshoots 1004 decrease again, which enables an increasing reduction of the overshoots 1004 with an increasing decrease of the switching time.

A resonant frequency results during the switching process, which is given by the series connection of both parasitic capacitances. When switching on or off outside the commutation process, as soon as one of the identical capacitances $C_{par1} = C_{par2} = C_{par}$ is short-circuited by an active device, a second resonant frequency with the following cycle duration results:

$$t_{ZOS,limit} = \frac{1}{2\pi\sqrt{LC_{par}}}$$

a value of 8.886 ns, which may correspond to the worst case consideration so that a critical switching time of $t_{ZOS\_limit}$ with exactly this cycle time $t_{ZOV,limit}$ may be specified. If the switching time falls below this value, a reduction of the overshoots 1004 may be obtained. This means that for an advantageous amplitude of the overshoots, any value between zero (nanoseconds) and a maximum of $t_{ZOS\_limit}$ may be obtained as a result for the switching time because the switching time is, e.g., smaller than half the above-determined cycle duration of the resonant frequency of the commutation resonant circuit. According to embodiments, the driving unit is accordingly configured to perform the switching process with a switching time that is shorter than 8 ns.

Figure 3C:
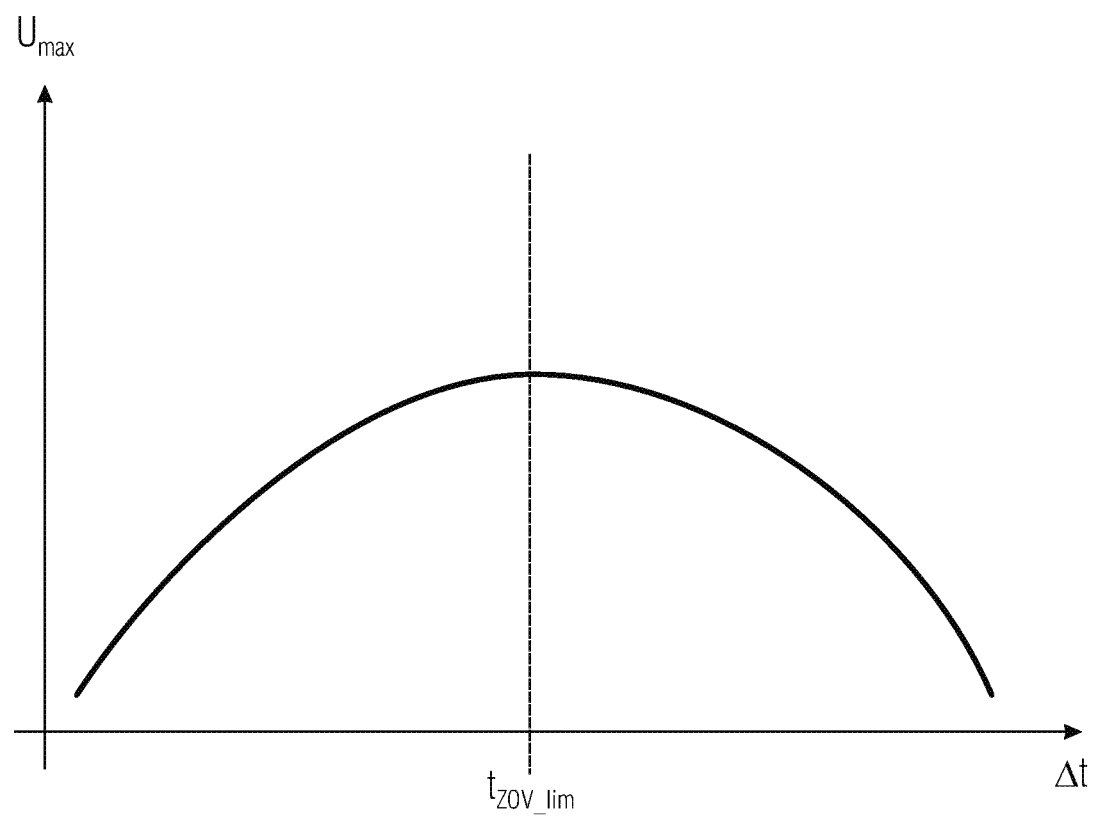
FIG. 3c shows a schematic graph for clarifying the relationship between a switching duration and the overshoots in apparatuses according to embodiments.

FIG. 3c shows a schematic graph for clarifying the connection between the switching time Δt and the overshoots in the sense of an amount of the overvoltage $U_{max}$. The driving unit 150 is configured to perform the switching circuit with a switching duration that is shorter than a cycle duration of a resonant frequency of the commutation resonant circuit, i.e. with a time that is at most the time $t_{ZOS\_lim}$.

Figure 4A:
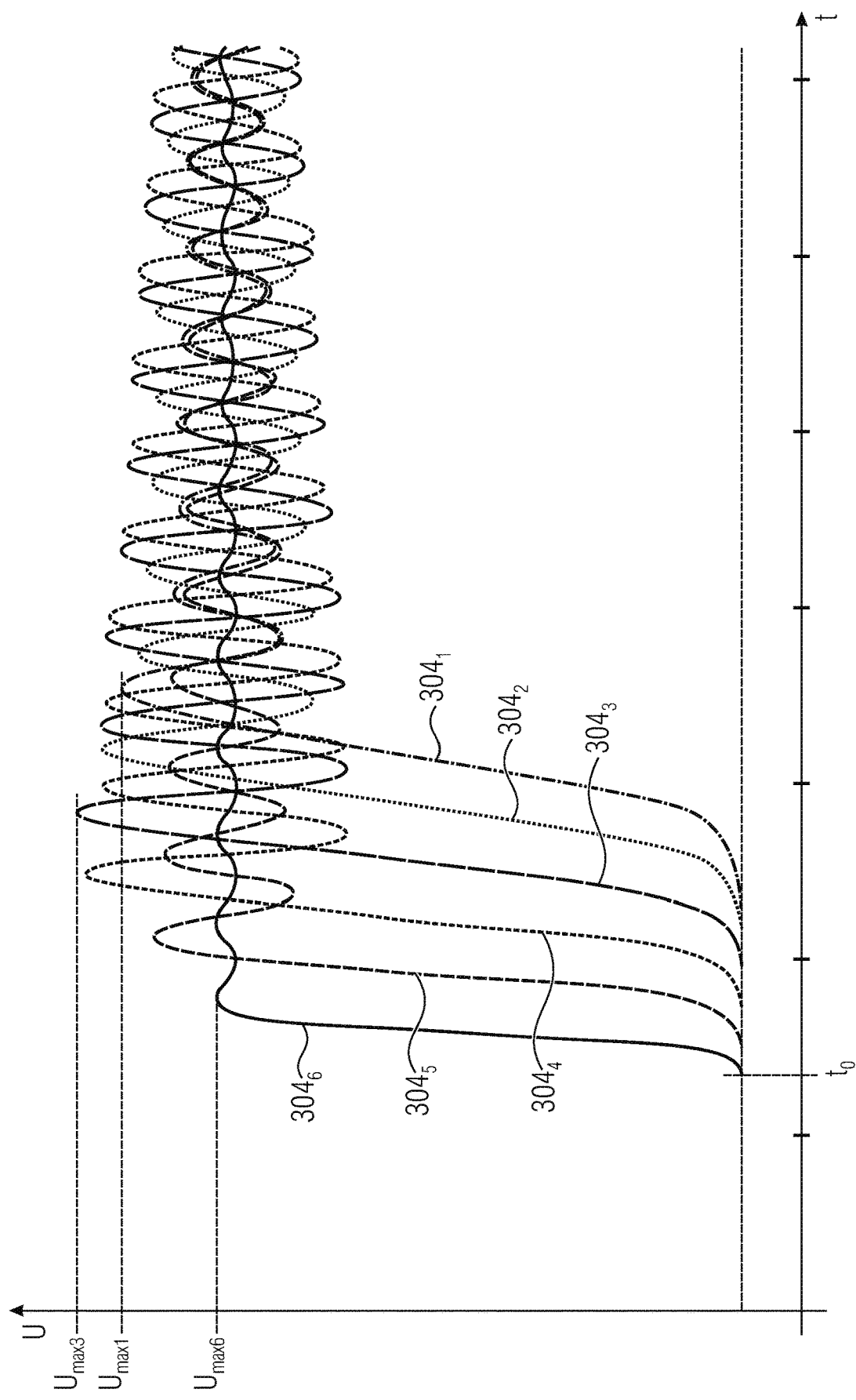
FIG. 4a shows a schematic graph with curves representing overshoots of a DC-DC converter with different gate series resistances according to embodiments.

FIG. 4a shows a schematic graph with curves 304$_1$ to 304$_6$ indicating overshoots $U_{max}$–$U_{nom}$ of an exemplary DC-DC converter with different gate series resistances and/or simulation results of the previous explanations. According to embodiments, the commutation resonant circuit is excited by the switching process. According to this embodiment, the DC-DC converter comprises a commutation circuit including a free-wheeling element, e.g. the free-wheeling element 204. For example, the free-wheeling diode 204 is on the one hand effective to provide a free-wheeling path for the load current and, on the other hand, to prevent the polarity reversal of CD and to therefore stop the oscillation. The activation of the free-wheeling diode 204 also changes the commutation resonant circuit since the capacitance CD is bridged by guiding the free-wheeling diode 204, i.e. is switched to be ineffectual.

During the commutation process, the resonant circuit of $C_T$, $C_D$ and $L_{par}$ therefore ideally only carries out a partial oscillation which consists of the superposition of charging the point MP by means of the load current $I_{PH}$ and the excited oscillation. With increasing switching time or decreasing switching time, the commutation resonant circuit performs an increasingly complete oscillation. Depending on the switching duration, the switching time may also be more than one oscillation duration, which, however, leads to increasingly higher switch-off overvoltages and increasingly high subsequent parasitic oscillation.

The abscissa shows the time axis t, the ordinate indicates the occurring voltage U. With an increasing curve index i=1, . . . ,6 of the curves 304$_i$, the gate series resistance reduces from, e.g., 10 ohms in curve 304$_1$ to 0 ohms in curve 304$_6$. While a possibly acceptable degree of overshoot may be obtained at a first resistance value, e.g. 10 ohms, of the curve 304$_1$, which may be represented by the maximum amplitude $U_{max1}$ a decrease of the gate series resistance, as shown in the curves 304$_2$ and 304$_3$, may lead to an increase of the maximum amplitude, which is also due to the decreasingly smoothed edge. This is also shown by the fact that the switching processes starting from time $t_0$ occur faster with a decreasing gate series resistance.

Surprisingly, it has now been found that when the gate series resistance falls below a certain value, the overshoots decrease again, as may be seen in curves 304$_1$ to 304$_6$, wherein an increasing decrease of the gate series resistance may lead to an increasing decrease of the overshoots. Since the gate series resistances are usually used to smooth-out the switching edges, i.e. for artificial delay, the teaching of FIG. 4a may also be seen in the fact that the arrangement of additional gate series resistances may be omitted and even parasitic gate series resistances may be omitted, in order to prevent losses with respect to the time or the switching performance. This refers to further, possibly all further, resistances effective in the series connection of the gate path. A resistance value between an ideal driving unit and the control terminal of semiconductor switches in apparatuses according to embodiments may therefore comprise values of at most 1 ohm, advantageously at most 0.5 ohms, or 0.1 ohms. With a non-ideal driving unit, this resistance value may already be the output resistance of the unit, e.g., the output resistance of a gate-driver circuit. In particular, apparatuses that are formed in absence of a separately arranged gate series resistance element may advantageously be formed.

In other words, FIG. 4a shows a result of simulations and apparatuses according to embodiments having typical devices, typical inductances, currents and voltages. For example, assumed were SiC elements such as diodes, as well as a resonant inductance, i.e. a parasitic inductance of 20 nH, as may occur in a normal module housing. A variation of the gate resistance from zero ohm to 10 ohms was carried out, wherein an internal series resistance, or an impedance, was present in the semiconductor switch. For example, the switching current was assumed to be 86 amperes. The intermediate circuit voltage was assumed to be 800 volts. The curves show drastic reductions of the losses and the overvoltage through faster switch-off, wherein the faster switch-off is also enabled by the decreasing gate series resistances. According to embodiments, an adaptation of the parasitic properties and/or devices is carried out for this, which may include matching the parasitic capacitances and/or an adaptation of the parasitic inductances so that a ZOS circuit is created. Furthermore, a suitable ZOS operation may be made possible by selecting the operating point.

Figure 4B:
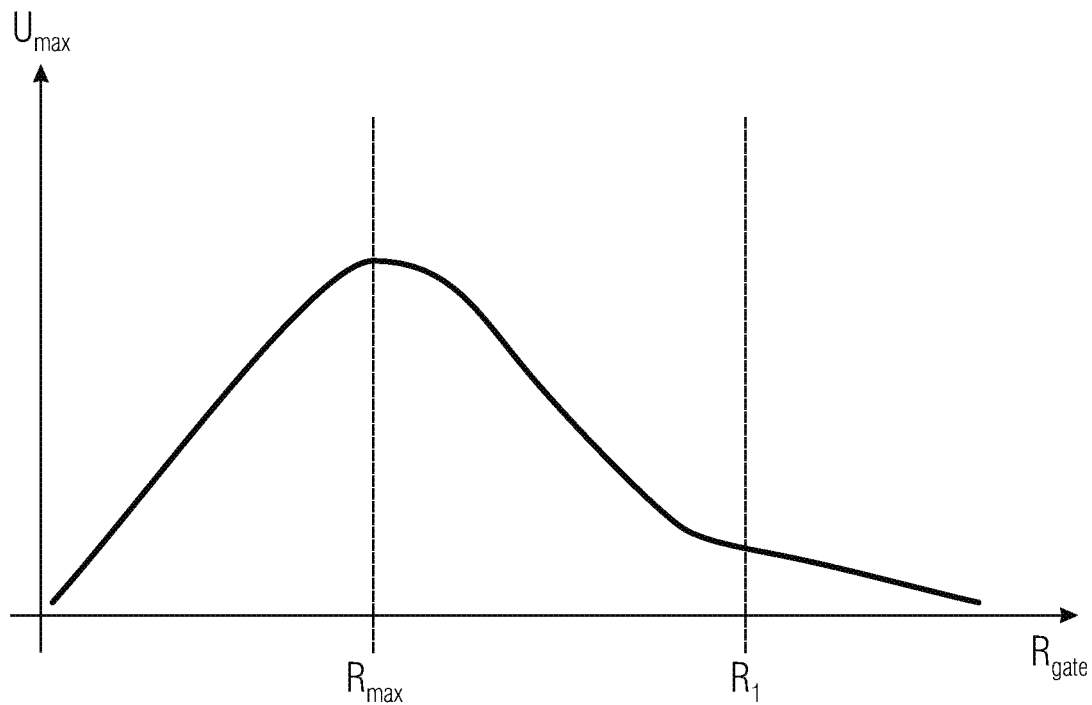
FIG. 4b shows a schematic graph of a comparison of the gate series resistance in contrast to the obtained maximum voltage according to an embodiment.

FIG. 4b shows a schematic graph of a comparison of the gate series resistance $R_{gate}$, which is plotted on the abscissa, and the obtained maximum voltage $U_{max}$, which is plotted on the ordinate. According to the conventional technology, a gate series resistance in the range of a resistance $R_1$ is typically used, which enables a lower value of the obtained overvoltages, as is shown in the curve 304$_1$ in FIG. 4a, for example. If the resistance value increases, e.g., an asymptotic decrease of the overvoltage may be obtained. If the gate series resistance decreases or is reduced, an increase of the overshoots may be observed. For this reason, the conventional technology tries to stay in the range of the gate series resistance $R_1$ or to make the same as large as possible. According to the invention, it was found that a renewed decrease of the overshoots may be obtained when falling below a gate series resistance $R_{max}$, which may be accompanied by increasingly steep switching edges, which make it possible to excite the commutation resonant circuit according to embodiments. For example, $R_{max}$ may be set to one ohm, e.g. to 0.5 ohms, or e.g. to 0.1 ohms, and does not necessarily correspond to a local or a global maximum of the overshoots.

A suitable operating point for the embodiments described herein may be set by configuring the driving unit such that the overshoot at the semiconductor switch is kept low by selecting the time instant of switching process such that the current flowing through the storage choke, e.g. the storage choke 112, fulfills the following condition within a tolerance range of 30%, advantageously 20%, more advantageously 15%, and even more advantageously 10%, or 5%, or as exactly as possible:

$$I_{PH} = \frac{2U_{ZK}\sqrt{2\frac{C_{par}}{L_{par}}}}{\pi}$$

wherein $C_{par}$ may indicate the parasitic capacitance value $C_{par1}$ or the capacitance value $C_{par2}$, which are equally formed in the context of embodiments. In other words, $C_{par}$ corresponds exactly to a capacitance $C_T$ or $C_D$, or $C_{par1}$, or $C_{par2}$, respectively, which, e.g., may be assumed to be identical for this equation. For capacitances of different sizes, oscillations may remain, but they can be kept within predefined limits. For real, non-linear and differently sized capacitances, the optimal ZOS point may be determined numerically, via simulation and/or through experiments.

The time instant of the switching operation may be influenced by the topology and application of the circuit in which this switching technology is to be applied. In order to adjust the current accordingly, on and off times of the transistor can be adjusted.

For example, in hard-switching topologies, it can be assumed that in many cases a current increases in the on-state of the switch. (In resonant converters, the current may also decrease over time). Therefore, an implementation may take into account that the current should increase (or decrease) until the ZOS current value IPH is reached. As soon as this value is reached, the desired switch-off time instant is reached.

Alternatively or additionally, the switch-off time may also be calculated, adjusted or specified by the topology (especially with resonant converters). According to embodiments, the switch-off time is selected by the controller/regulator in such a way that the involved current is available at the switch-off time.

In other words, the circuit and the operation mode may be adapted such that an almost infinitely fast switching or an infinitely fast switching of the switch is enabled. Thus, switching losses may be reduced to a physical minimum. Efficiency increases, losses decrease, chip surface area decreases and/or costs are saved. The circuit and/or the adapted operating mode enable a near or completely overvoltage-free switch-off. This makes it possible for the switches to be operated up to their blocking electric strength. It is no longer necessary to maintain such a large voltage reserve. With the same voltage class, circuits may therefore be operated with a high voltage and therefore a higher power. The circuit and the operating mode reduce or prevent the parasitic oscillations on the intermediate circuit and therefore significantly reduce the filter effort involved to fulfill EMC guidelines. Embodiments are not dependent on a low-inductance intermediate circuit since an adaptation of the resonant frequency to any capacitance values or inductance values is made possible. The terminals and the design of a connector may be optimized according to cost criteria, insulation criteria, mechanical aspects or other design criteria. Large mechanical structures such as screw-on points far away from each other with safe insulation and high mechanical load bearing capacity may therefore be implemented without any problems. The conductors may consist of simple cross-pieces and are not dependent on being realized by complex low-inductance bus bars (bus leads).

Figure 5A:
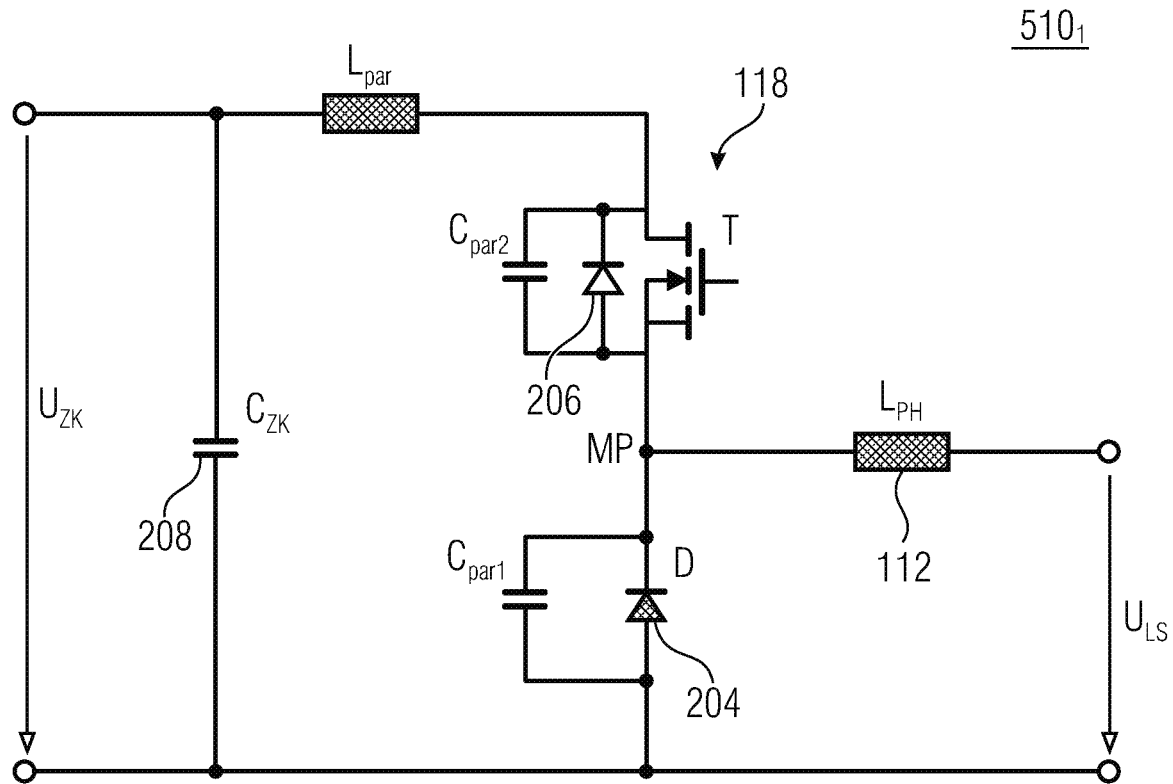
FIG. 5a shows a schematic block circuit diagram of a buck converter usable in apparatuses according to embodiments.

FIG. 5a shows a schematic block circuit diagram of a buck converter $510_1$, which may be used as an alternative or in addition to the DC-DC converter 110 and/or 210 in apparatuses according to embodiments.

Figure 5B:
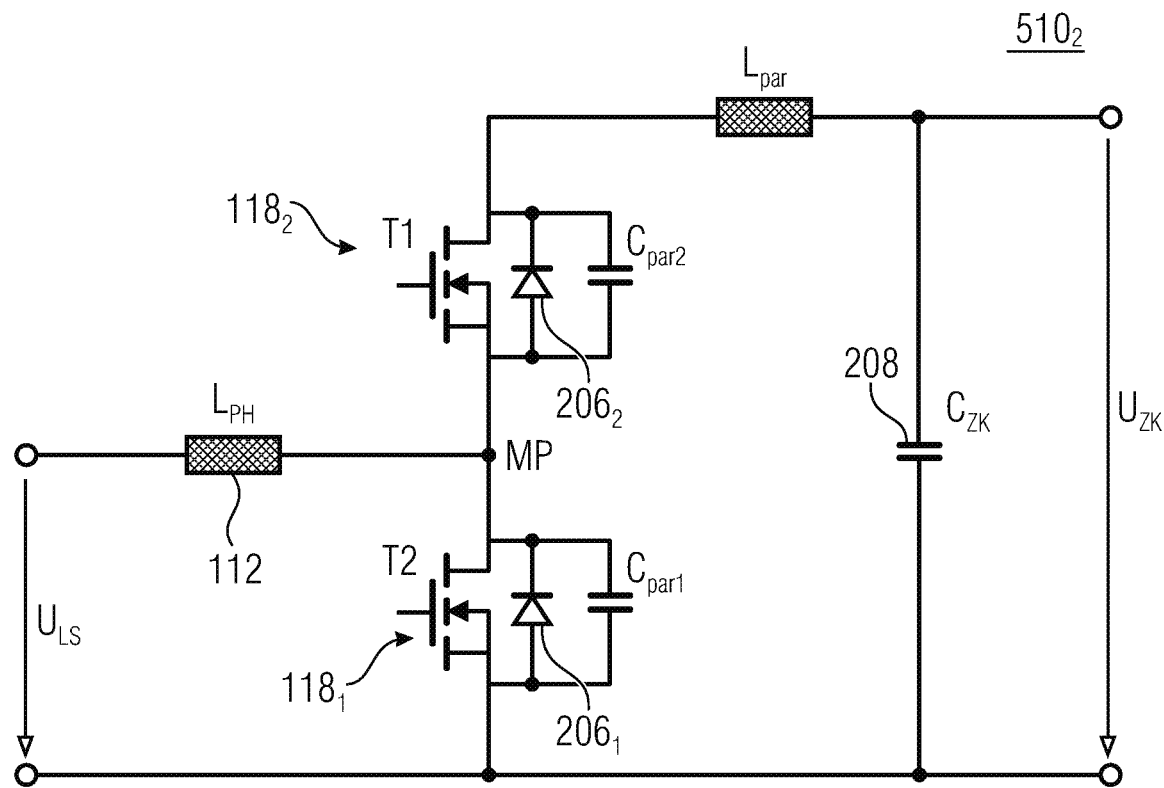
FIG. 5b shows a schematic block circuit diagram of a half-bridge converter usable in apparatuses according to embodiments.

FIG. 5b shows a schematic block circuit diagram of a half-bridge converter $510_2$, which may be used as an alternative or in addition to the DC/DC converters 110, 210 and/or $510_1$ in apparatuses according to embodiments.

Figure 5C:
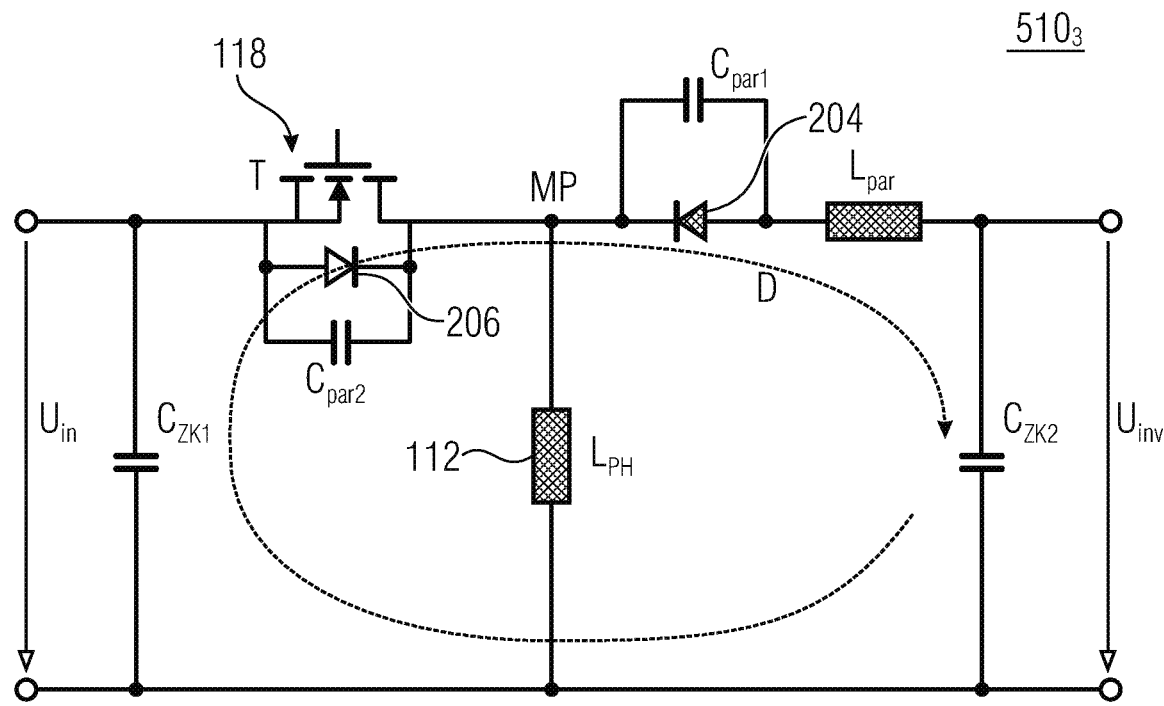
FIG. 5c shows a schematic block circuit diagram of an inverting converter usable in apparatuses according to embodiments.

FIG. 5c shows a schematic block circuit diagram of an inverting converter $510_3$, which may be used as an alternative or in addition to the DC/DC converters 110, 210, and/or $510_1$ and/or $510_2$ in apparatuses according to embodiments.

According to further embodiments, different converters, e.g. a full-bridge converter and/or a flyback converter, may be arranged. Even a flyback converter is excellently suited for the embodiments described herein. The requirements or challenges may be considered to be identical. The classic flyback comprises high overvoltages due to the stray inductance. The stray inductance may be used for the embodiments (ZOS) described herein.

The embodiments described herein enable a performance regulation despite a possibly small operating point window in the ZOS mode. For example, individual parallel strings (so-called phases) may be switched off and on. For example, with a 6-phase converter, a performance variation of 100% to 16.6% may be possible. Within the described operating points, a variation may be carried out such that the ideal operating point may be deviated from. Although this may lead to an increase of the overvoltages or oscillations, this may remain unchanged within a permitted range, for example within ±30%, ±10%, or less.

Alternatively or additionally, a so-called valley skipping may be carried out by varying the power of the converter by shifting the switch-on time and therefore creating periods without effective power transmission.

For example, this enables a power regulation by a factor of approximately 2. Alternatively or additionally, a so-called burst mode may be driven, which may be advantageous particularly for the very low load range, as it gives the possibility to only transmit a load in a sporadic manner. This allows an operation of down to 0% of the load in each converter.

Figure 6A:
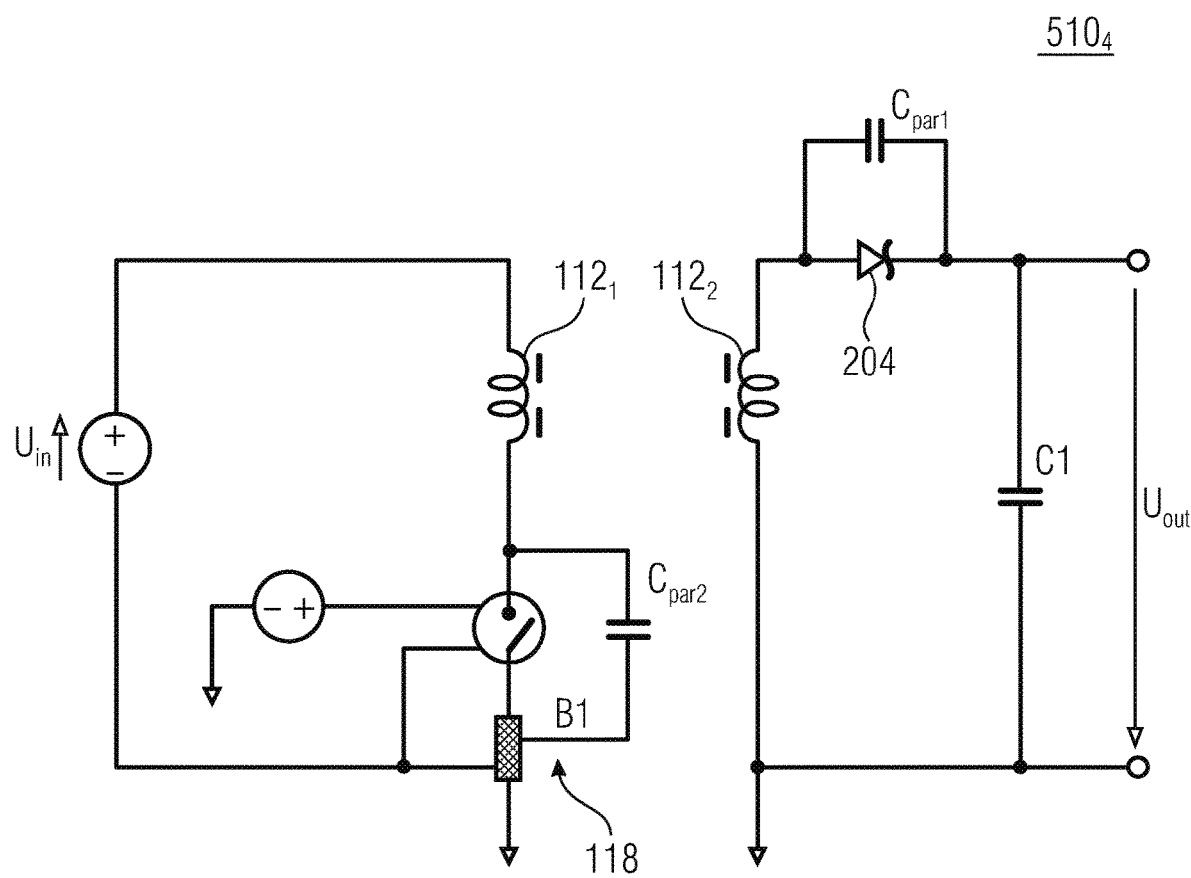
FIG. 6a shows a schematic block circuit diagram of a flyback converter usable in apparatuses according to embodiments.
Figure 6B:
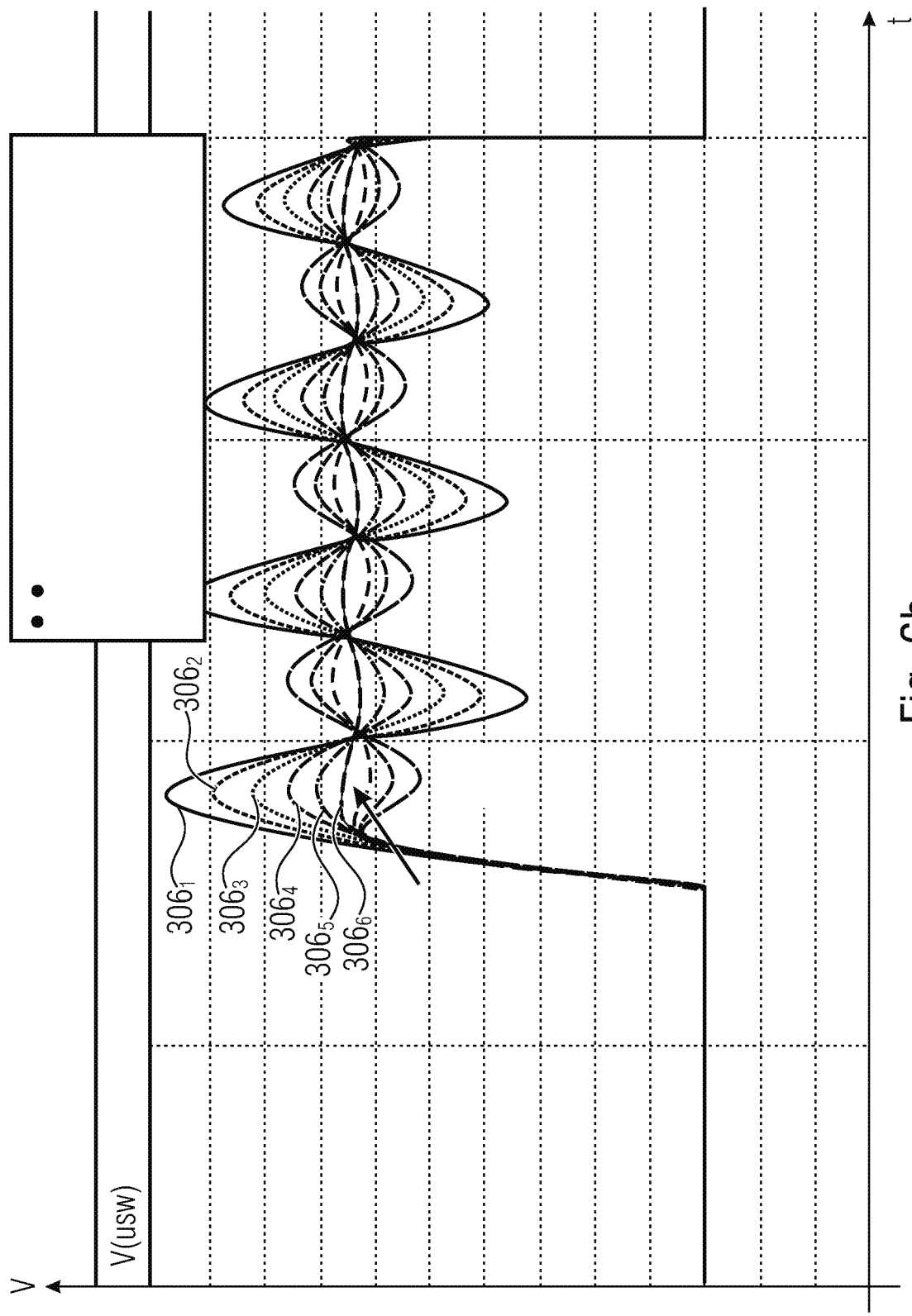
FIG. 6b shows a schematic graph with a voltage at the semiconductor switch of the converter of FIG. 6a according to an embodiment.

FIG. 6a shows a schematic block circuit diagram of a flyback converter $510_4$, which may be used in apparatuses according to embodiments as an alternative or in addition to the other DC-DC converters described herein. Here, the current source includes a transformer circuit with a first side $112_1$ and a second side $112_2$ which each may be configured as a choke. FIG. 6b shows a schematic diagram with oscillations excited in the flyback converter of FIG. 6a.

FIG. 6b shows a schematic graph with a voltage at the semiconductor switch 118 of the converter $510_4$ of FIG. 6a, plotted at the ordinate across the time axis t. Curves $306_1$ to $306_6$ show in increasing index order an increasing adaptation of the flyback converter $510_4$ to the ZOS operation described. This means that the parasitics $C_{par}$, and $C_{par2}$ may be adapted to each other, that the switching point is selected dependent on the current by the choke $112_1$ and that the switching is performed in a corresponding speed. The curve $306_1$ shows an unadapted output capacitance of a flyback converter which is unadapted according to the conventional technology and is formed in absence of a snubber, for example. In curve $306_6$, the overshoots are comparatively low.

The curves show a variation of the secondary-side capacitance in case that the natural output capacitance of the switch and the natural stray inductance are used in a parasitic manner. Alternatively or additionally, an adaptation/increase of the switching capacitance $C_{par2}$ or the stray inductance $L_{par}$ may be implemented.

A realization of a series inductance of the embodiments described herein may be obtained by adjusting the magnetic coupling between the primary and secondary sides in the transformer accordingly. This may have a direct effect on the commutation circuit inductance. This series inductance may act in addition to the parasitic inductance. Embodiments allow the use of simple capacitors and the omission of complex snubber capacitors, block capacitors or pulse capacitors. Alternatively or additionally, embodiments allow the use of generally wired devices instead of non-inductive variations such as TO (transistor outline) packages. Capacitances may be realized by installing high-capacitive switches, e.g. trench switches, and/or by using large surface areas by installing heavy-duty silicon capacitors and/or ceramic capacitors.

The embodiments described herein enable novel circuit topologies. The commutation circuit inductance may be used as an effective device of the circuit, while this does not exclude the usage of additional discrete inductances and/or corresponding terminals. Furthermore, output capacitances may be used as an active device of the circuit in connection with the series inductance. The embodiments enable a reduction of overvoltages through the reduction of the gate resistance to parasitic amounts, e.g., through the gate driver and/or the internal gate resistance of the transistor. This may be referred to as a reduction of the gate resistance to amounts which do not significantly influence/decelerate the switching process of the transistor, e.g., in addition to the output resistance of the driving unit in the range of below 1 ohm for a SiC chip with a size of 25 mm². This means that a combination of a driver resistance value, a line resistance value and an optional additional and, possibly discrete, resistance value (R(driver)+R(line)+R(optional resistance)) is lower than 1 ohm. This also includes the absence of discrete resistance elements. Furthermore, this enables the implementation of passive and active devices within an additional voltage reserve of ±30% or ±10%, for example. This may be achieved by selecting the switch-off currents such that these are within the range of the ZOS operation, e.g. within the stated tolerance ranges. This may also be applied to several phases by adjusting the current or the mean current per phase using the ZOS operation.

Figure 7:
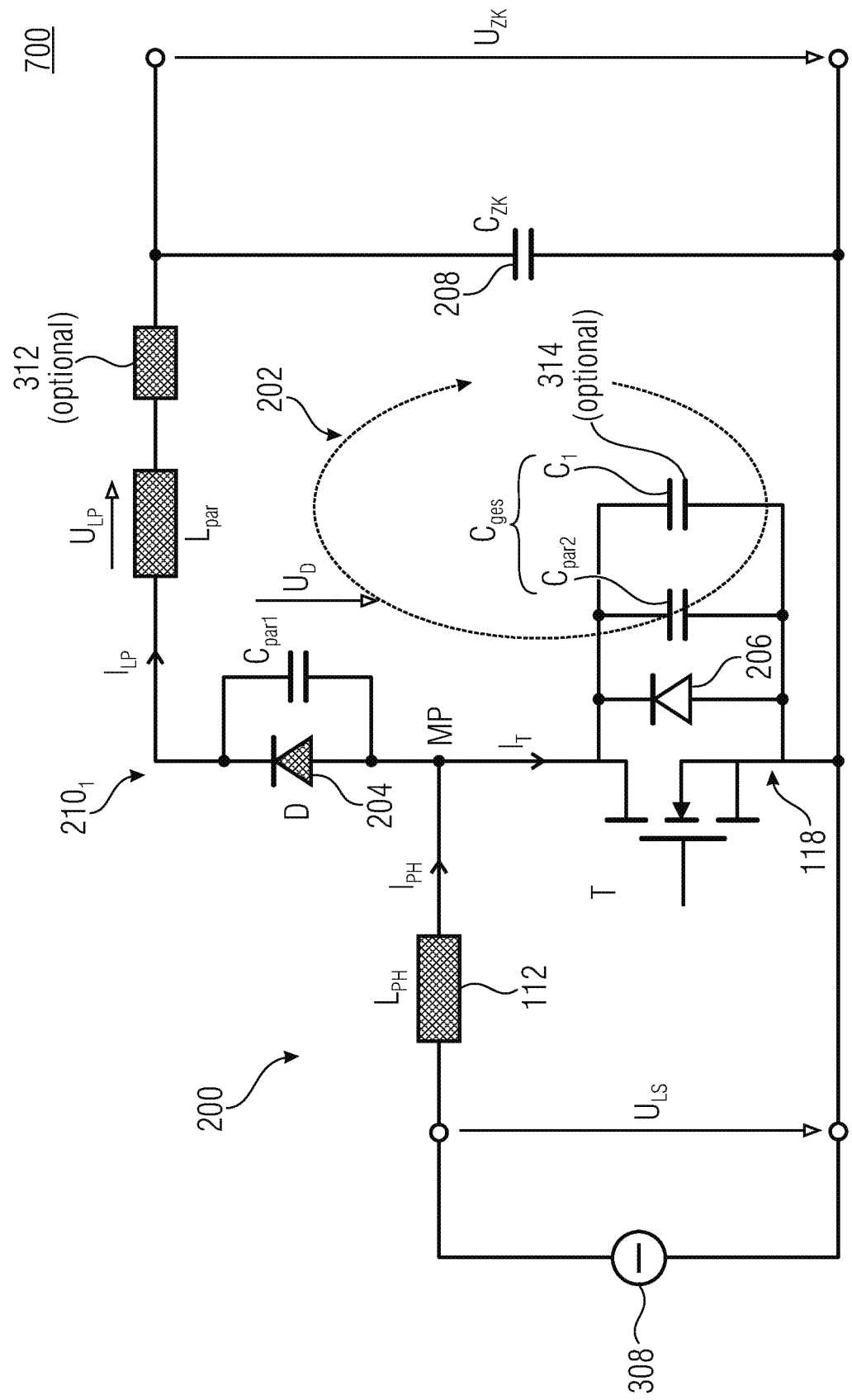
FIG. 7 shows a schematic block circuit diagram of an electric circuit according to an embodiment.

FIG. 7 shows a schematic block circuit diagram of an electric circuit 700 according to an embodiment. For example, the electric circuit 700 includes the apparatus 200 and a modified DC-DC converter $210_1$ according to an embodiment. Alternatively or additionally, other DC-DC converters described herein may be employed. The electric circuit includes a voltage source 308 that is electrically coupled to the semiconductor switch 118, e.g., in order to convert a convertible voltage $U_{LS}$. The voltage source 308 is configured to apply the voltage $U_{LS}$ to the DC-DC converter $210_1$, which corresponds to at least 84% of a blocking voltage of the semiconductor switch 118, during an operation of the apparatus, or the electric circuit 700. According to further embodiments, a voltage of at least 90% or at least 95% may be applied. It is also possible to apply voltages that essentially or approximately correspond to 100% of the blocking voltage of the semiconductor switch 118 since a compensation of the overshoots is made possible by the embodiments. In the configuration according to FIG. 7, wherein a step-up converter is used as the DC-DC converter $210_1$, the voltage source 308 may be arranged at an input side. Alternatively, e.g. when using a step-down converter, the DC-DC converter may be configured to, based on the input voltage provided by the electric voltage source 308, provide an electric output voltage that corresponds to at least 84%, at least 90%, or at least 95%, but also 100%, or approximately 100% of the blocking voltage of the semiconductor switch.

In contrast to the DC-DC converter 210 of FIG. 2a, the DC-DC converter $210_1$ may be modified in that it may include an optional discrete inductance 312, e.g., formed through lines or coils such as air coils or coils with a magnet core. Known concepts try to keep the inductance of the commutation circuit low. According to embodiments, however, an adaptation of the inductance by adding parasitic and/or discrete inductances is used in order to obtain a match of the relationship described in connection with FIG. 2a. This means that the inductance of the commutation circuit is artificially increased.

Alternatively or additionally, the DC-DC converter $210_1$ may optionally comprise a discrete capacitance such as a capacitor, which may possibly be arranged in parallel to the parasitic capacitance $C_{par2}$ and/or $C_{par1}$, in order to adapt the respective capacitance. The additional discrete devices 312 and/or 314 may be arranged to act in the commutation circuit 202, i.e. to be part of the area resonant circuit. Such a modification may also be implemented in absence of the voltage source so that the explanations with regard to the optional additional elements also apply for the apparatuses described herein. In particular, in apparatuses described herein, a symmetry with respect to the effective capacitance over the free-wheeling element 204 and the semiconductor switch 118 may be obtained, e.g., by adding electric capacitances. Also, based on added electric impedances, an adaptation to the equation of the phase current explained in connection with FIG. 2a may be obtained.

Contrary to the prevailing opinion that a reduction of overvoltages in the DC-DC converter is made possible by low inductances and slow switching times, the embodiments described herein enable solutions based on a contradictory teaching. Surprisingly, a decreasing overvoltage may be obtained with increasing current and increasing switching speed. With this, long-existing problems of the conventional technology may be solved and a continuing compromise between switching losses and switching speeds/switch-off overvoltages may be resolved. According to the conventional technology, semiconductor switches are decelerated with gate series resistances, as may be found in the respective data sheets. Screw-on terminals at semiconductor switches dominate over low-inductance modules. The embodiments described herein enable a highly efficient operation since hardly any oscillations occur. This is favorable for EMC requirements, favorable for the reduction of losses and therefore also for the reduction of costs.

In the ideal case, the current $L_{par}$ does not over-oscillate. In the ideal case, there is also no permanent oscillation, which means that an oscillation is carried out incompletely at the most. In reality, this is not 100% possible, particularly due to a non-ideal step, i.e. a finitely steep edge. However, the consideration may be used approximately.

According to an embodiment, several aspects of embodiments described herein are combined. An electric circuit according to embodiments may comprise an apparatus such as an apparatus described herein. The same may include the following: a DC-DC converter with a semiconductor switch and a storage choke 112, wherein the DC-DC converter comprises a commutation resonant circuit that is determined at least partially by parasitic characteristics $L_{par}$, $C_{par}$ of the DC-DC converter. Furthermore, the apparatus may comprise a driving unit 150 configured to switch the semiconductor switch 118 by performing a switching process. The driving unit 150 is configured to perform the switching process with a switching duration $\Delta t$ that is shorter than a cycle duration of a resonant frequency of the commutation resonant circuit. The driving unit 150 is configured to select a time instant of the switching process $t_0$ such that a current $I_{PH}$ flowing through the storage choke 112 generates an overshoot $U_{max}-U_{nom}$ at the semiconductor switch 118 of at most 30% with respect to an idle state $U_{nom}$ of the semiconductor switch 118. Simultaneously, the commutation resonant circuit may comprise a discrete inductive or capacitive device that is switched in order to act in combination with a parasitic capacitance value $C_{par}$; $C_{par1}$; $C_{par2}$ or a parasitic inductance value $L_{par}$ of the commutation resonant circuit and to influence its resonant frequency, e.g. as a serial or parallel element such as the element 312 and/or 314. The driving unit 150 may be configured to, in order to generate the overshoot at the semiconductor switch 118 of at most 30% with respect to an idle state $U_{nom}$ of the semiconductor switch 118, select the time instant $t_0$ of the switching process such that the current $I_{PH}$ flowing through the storage choke 112 fulfills the following condition within a tolerance range of 30%:

$$I_{PH} = \frac{2U_{ZK}\sqrt{2\frac{C_{par}}{L_{par}}}}{\pi}$$

wherein $I_{PH}$ includes the current through the storage choke at the time instant of switching, $U_{ZK}$ includes an electric voltage of the DC-DC converter, or the commutation voltage, $C_{par}$ includes a linearized parasitic electric capacitance value of the DC-DC converter and $L_{par}$ includes a parasitic inductance value of the DC-DC converter.

According to a further embodiment, the electric circuit may obtain the parasitic inductance $L_{par}$ by means of a corresponding implementation of the electric conductor of the apparatus. This means that the parasitic inductance is adapted by means of the implementation of the conductors, for connecting the electric voltage, e.g., with respect to the length, the width, the height and/or the cross-section and the like, such that the desired inductance value is obtained.

Even though some aspects have been described within the context of an apparatus, it is understood that said aspects also represent a description of the corresponding method, so that a block or a structural component of an apparatus is also to be understood as a corresponding method step or as a feature of a method step. By analogy therewith, aspects that have been described within the context of or as a method step also represent a description of a corresponding block or detail or feature of a corresponding apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An apparatus, comprising:
   a DC-DC converter comprising a semiconductor switch and a current source, the DC-DC converter comprising a commutation resonant circuit that is at least partially determined by parasitic characteristics of the DC-DC converter;
   a driving unit configured to switch the semiconductor switch by performing a switching process;
   wherein the driving unit is configured to perform the switching process with a switching duration that is shorter than a cycle duration of a resonant frequency of the commutation resonant circuit; and
   wherein the driving unit is configured to select a time instant of the switching process such that a current provided by the current source generates an overshoot at the semiconductor switch of at most 30% with respect to an idle state of the semiconductor switch.

2. The apparatus according to claim 1, wherein the overshoot at the semiconductor switch refers to a power output of the semiconductor switch.

3. The apparatus according to claim 1, wherein the DC-DC converter comprises a free-wheeling element that, together with the semiconductor switch, is part of a commutation circuit, wherein a first electric capacitance value acting in parallel to the free-wheeling element and a second electric capacitance value acting in parallel to the semiconductor switch are equal within a tolerance range of 30%, wherein the first capacitance value and the second capacitance value act in the commutation resonant circuit.

4. The apparatus according to claim 3, wherein the first electric capacitance value or the second electric capacitance value are formed by a combination of a parasitic electric capacitance value and a capacitive device.

5. The apparatus according to claim 1, wherein the commutation resonant circuit comprises at least one electric capacitance value acting in parallel to the semiconductor switch and one electric inductance value connected in series.

6. The apparatus according to claim 1, wherein the driving unit is configured to, in order to generate the overshoot at the semiconductor switch of at most 30% with respect to an idle state of the semiconductor switch, select the time instant of the switching process such that the current provided by the current source fulfills the following condition within a tolerance range of 30%:

$$I_{PH} = \frac{2U_{ZK}\sqrt{2\frac{C_{par}}{L_{par}}}}{\pi}$$

wherein $I_{PH}$ comprises the current of the current source at the switching time instant, $U_{ZK}$ comprises an electric voltage of a DC-DC converter, $C_{par}$ comprises a linearized parasitic electric capacitance value of the DC-DC converter and $L_{par}$ comprises a parasitic inductance value of the DC-DC converter.

7. The apparatus according to claim 1, wherein the commutation resonant circuit comprises a discrete conductive or capacitive device that is connected to act in combination with a parasitic capacitance or a parasitic inductance value of the commutation resonant circuit and to influence its resonant frequency.

8. The apparatus according to claim 1, wherein the driving unit is configured to perform the switching process with a switching duration that is shorter than half of a cycle duration of the resonant frequency of the commutation resonant circuit.

9. The apparatus according to claim 1, wherein the driving unit is configured to perform the switching process with a switching duration that is shorter than 8 ns.

10. The apparatus according to claim 1, wherein the semiconductor switch comprises a control terminal that is connected to the driving unit, wherein, in addition to an output resistance of the driving unit, a resistance value between the driving unit and the control terminal comprises a value of 1 Ω at the most.

11. The apparatus according to claim 9, the apparatus being formed in absence of a gate series resistance element.

12. The apparatus according to claim 1, wherein the excitation resonant circuit is excited by the switching process, wherein the DC-DC converter comprises a commutation circuit comprising a free-wheeling element, the free-wheeling element being effective to stop an oscillation of the excitation resonant circuit before the end of a complete oscillation period so that the excitation resonant circuit performs an incomplete oscillation at the most.

13. The apparatus according to claim 1, wherein the semiconductor switch is configured to be operated in an intended operation in a hard-switching manner; and/or wherein the driving unit is configured to hard-switch the semiconductor switch.

14. The apparatus according to claim 1, wherein the commutation resonant circuit is part of a commutation cell of the DC-DC converter.

15. The apparatus according to claim 1, wherein the DC-DC converter comprises one of a boost converter, a buck converter, a half-bridge converter, a full-bridge converter, an inverting converter and a flyback converter.

16. The apparatus according to claim 1, wherein the apparatus is formed in absence of a snubber.

17. An electric circuit comprising an apparatus according to claim 1, and an electric voltage source coupled to the semiconductor switch;
wherein the electric voltage source is configured to, during an operation of the apparatus, apply to the DC-DC converter an electric voltage that temporarily corresponds to at least 84% of a blocking voltage of the semiconductor switch;
or
wherein the DC-DC converter is configured to, based on an electric input voltage provided by the electric voltage source, provide an electric output voltage that temporarily corresponds to at least 84% of a blocking voltage of the semiconductor switch.

18. The electric circuit according to claim 15, wherein the parasitic inductance is achieved by a corresponding implementation of electric conductors of the apparatus.

19. An apparatus, comprising:
a DC-DC converter with a first side and a second side, having arranged therebetween a commutation cell comprising a semiconductor switch and a free-wheeling element;
wherein the commutation circuit is connected to a current source configured to provide a phase current for the DC-DC converter;
wherein, during an idle state of the semiconductor switch, a commutation voltage is present in the commutation cell;
wherein the commutation circuit comprises a commutation resonant circuit comprising an electric inductance value and an electric capacitance value, wherein the commutation resonant circuit is formed such that, within a tolerance range of 30%, the following applies:

$$I_{PH} = \frac{2U_{ZK}\sqrt{2\frac{C}{L}}}{\pi}$$

wherein $I_{PH}$ describes the phase current at the switching time instant, $U_{ZK}$ describes the commutation voltage, C describes the electric capacitance value and L describes the electric inductance value.

20. The apparatus according to claim 19, wherein an electric capacitance and/or an electric inductance of the commutation resonant circuit is adapted by means of additional discrete devices.

* * * * *